United States Patent
Ali

(10) Patent No.: US 11,342,930 B2
(45) Date of Patent: May 24, 2022

(54) TRACK AND HOLD CIRCUITS FOR HIGH SPEED ADCS

(71) Applicant: Analog Devices, Inc., Wilmington, MA (US)

(72) Inventor: Ahmed Mohamed Abdelatty Ali, Oak Ridge, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 17/098,724

(22) Filed: Nov. 16, 2020

(65) Prior Publication Data

US 2021/0083683 A1 Mar. 18, 2021

Related U.S. Application Data

(63) Continuation of application No. 16/193,202, filed on Nov. 16, 2018, now Pat. No. 10,840,933.

(60) Provisional application No. 62/595,470, filed on Dec. 6, 2017.

(51) Int. Cl.
| | |
|---|---|
| *H03M 1/00* | (2006.01) |
| *H03M 1/10* | (2006.01) |
| *H03M 1/12* | (2006.01) |
| *H03M 1/06* | (2006.01) |
| *H03M 1/18* | (2006.01) |
| *H03G 3/30* | (2006.01) |

(52) U.S. Cl.
CPC ....... *H03M 1/1033* (2013.01); *H03M 1/0641* (2013.01); *H03M 1/1225* (2013.01); *H03M 1/1245* (2013.01); *H03M 1/186* (2013.01); *H03G 3/30* (2013.01); *H03M 1/001* (2013.01); *H03M 1/06* (2013.01); *H03M 1/1009* (2013.01); *H03M 1/12* (2013.01); *H03M 1/1215* (2013.01)

(58) Field of Classification Search
CPC ...... H03M 1/12; H03M 1/1009; H03M 1/001; H03M 1/06; H03M 1/0641
See application file for complete search history.

(56) References Cited

U.S. PATENT DOCUMENTS

| | | | | |
|---|---|---|---|---|
| 5,248,973 | A | * 9/1993 | Babu | .............. H03M 1/0643 341/118 |
| 2005/0275580 | A1 | 12/2005 | Hong et al. | |
| 2006/0284754 | A1 | 12/2006 | Garrity et al. | |
| 2007/0013571 | A1 | * 1/2007 | Fujimoto | ............ H03M 1/0836 341/155 |
| 2007/0109168 | A1 | * 5/2007 | Hennessy | ............ H03M 1/0639 341/155 |

(Continued)

OTHER PUBLICATIONS

Office Action issued in DE 10 2018 131 039.0 dated Feb. 1, 2021, 11 pages (DE translation only).

*Primary Examiner* — Joseph J Lauture
(74) *Attorney, Agent, or Firm* — Patent Capital Group

(57) ABSTRACT

A dither capacitor, separate from the capacitor sampling the input signal, can be used to inject the additive dither in the switched-capacitor network of the track and hold circuit. This implementation can be referred to as a split-capacitor dither injection. The dither capacitor can be connected to a summing node of the switched-capacitor network. Using a separate capacitor allows the dither to be isolated from the capacitor that is sampling the input signal and avoids kick-back errors.

20 Claims, 24 Drawing Sheets

(56) References Cited

U.S. PATENT DOCUMENTS

| | | | |
|---|---|---|---|
| 2008/0084340 A1* | 4/2008 | Hurrell | H03M 1/0641 341/131 |
| 2011/0210877 A1* | 9/2011 | Ali | H03M 1/1033 341/120 |
| 2013/0120171 A1* | 5/2013 | Dinc | H03M 1/0641 341/110 |

* cited by examiner

TRACK AND HOLD CIRCUITS FOR HIGH SPEED ADCS

PRIORITY DATA

This patent application claims priority to and receives benefit of U.S. patent application Ser. No. 16/193,202, titled "MULTI-INPUT CONVERTERS USING CODE MODULATION", filed on Nov. 16, 2018, which claims priority to and receives benefit from U.S. Provisional Patent Application, Ser. No. 62/595,470, titled "MULTI-INPUT DATA CONVERTERS USING CODE MODULATION", filed on Dec. 6, 2017. Both patent applications are hereby incorporated in their entirety.

TECHNICAL FIELD OF THE DISCLOSURE

The present disclosure relates to the field of integrated circuits, in particular to multi-input data converters using code modulation.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements, and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure, features, and advantages thereof, reference is made to the following description, taken in conjunction with the accompanying figures, wherein like reference numerals represent like parts, in which.

DETAILED DESCRIPTION

Overview

Figure 1:
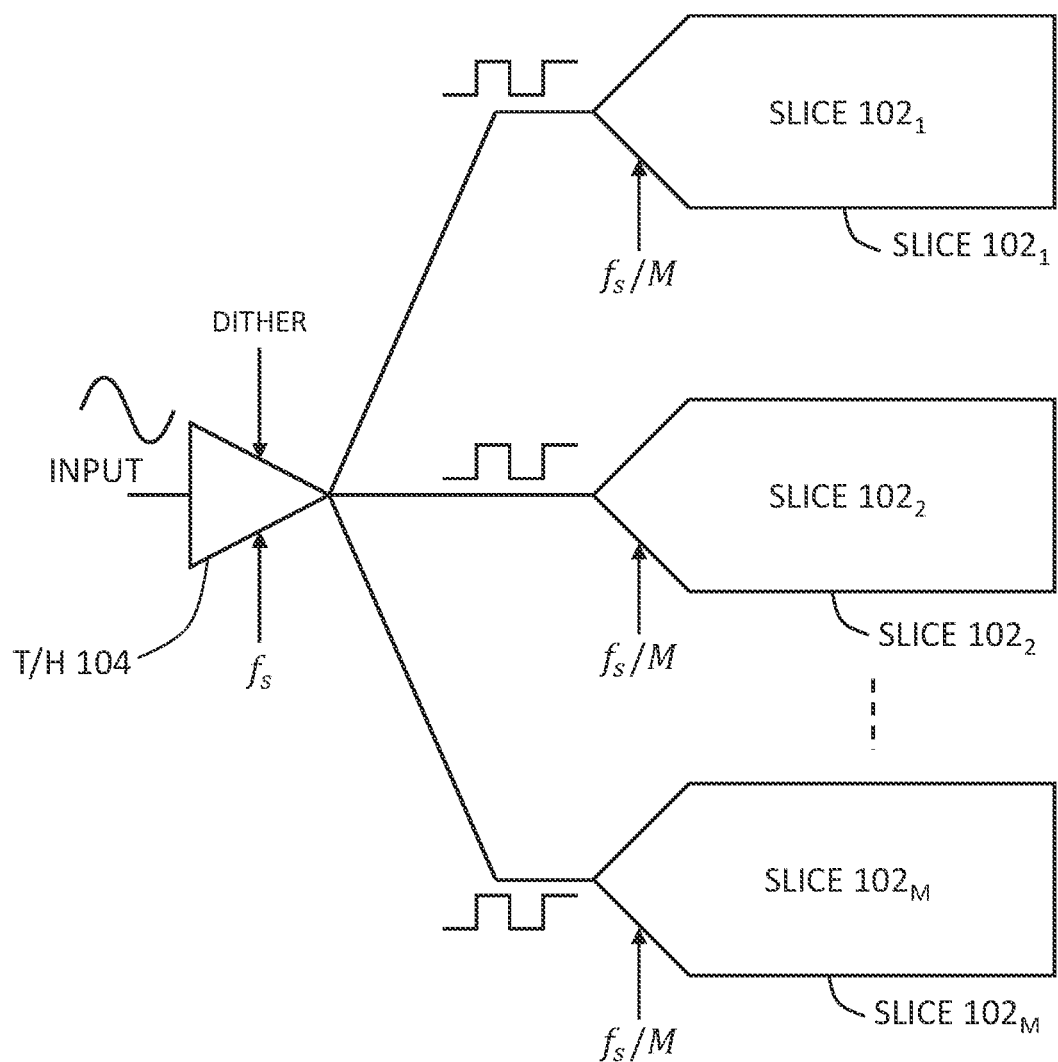
FIG. 1 shows a track and hold circuit driving M ADCs of a time-interleaved ADC, according to some embodiments of the disclosure.

A multi-input ADC, i.e., a single ADC, can receive multiple analog input signals and generate multiple digital outputs. To combine multiple analog input signals into a single multi-input ADC, the multi-input ADC would typically include multiple track and hold (T/H) circuits and an adder, which can consume a significant amount of power and incur large cost overhead. An improved approach is to combine multiple inputs through a unique T/H circuit in the front-end of the ADC. The multiple analog input signals can be aggregated using code sequences, without requiring a significant amount of external circuits.

High Speed ADCs

ADCs are electronic devices that convert a continuous physical quantity carried by an analog signal to a digital output or number that represents the quantity's amplitude (or to a digital signal carrying that digital number). An ADC can be defined by the following application requirements: its speed (number of samples per second), its power consumption, its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal-to-noise ratio SNR, total harmonic distortion THD, total harmonic distortion plus noise THD+N, and spurious free dynamic range SFDR. ADCs have many different designs, which can be chosen based on the application requirements and specifications.

To achieve higher speeds, interleaving is used to increase the sample rate of ADCs. A time-interleaved ADC can use M ADCs to sample an analog input signal to produce digital outputs. The M ADCs (referred herein as the M slices or M channels), operating in a time-interleaved fashion, can increase the sampling speed several times compared to the sampling speed of just one ADC. The M ADCs can be used in parallel, where the M ADCs can operate to sample an analog input one after another in a time-interleaved fashion. Using appropriate clocking to control the ADCs can greatly increase the effective combined ADC sampling rate. In some cases, the M ADCs are selected sequentially one after another to sample the input signal.

In some other cases, the M ADCs can be selected in a pseudo-random fashion. Since not all M ADCs are exactly matched or the same, discrete tones (spurs) would be present if the selection was sequential, e.g., where the M ADCs are used according to a fixed sequence. Pseudo-randomization helps spread the discrete mismatch error tones into the noise floor of the spectrum of the ADC output.

High speed ADCs, typically running at speeds on the order of giga-samples per second, are particularly important in fields such as communications and instrumentation. The input signal can have a frequency in the giga-hertz range, and the ADC may need to sample in the range of giga-samples per second. High frequency input signals can impose many requirements on the circuits receiving the input signal, i.e., the "front-end" circuitry of the ADC. The circuit not only has to be fast, for some applications, the circuit needs to meet certain performance requirements, such as SNR, and SFDR. Designing an ADC that meets speed, performance, area, and power requirements is not trivial, since faster speeds and higher performance often come at the cost of area and power.

High Speed Track and Hold (T/H) Circuits

Track and hold (T/H) circuits can be an important part of the input circuitry for ADCs. T/H circuits convert the continuous-time input signal into a discrete-time held signal for the ADC(s) which follow the T/H circuits. The ADC(s) can perform conversion based on the discrete-time held signal provided by the T/H circuit. For interleaved ADCs with M ADCs, separate T/H circuits can be provided for each one of the M ADCs, where the individual T/H circuits can run at the (slower) speed of the M ADCs. Running them at the speed of the M ADCs can make the T/H circuits simpler to design. However, distributing the T/H circuits to the M channels means there can be timing and/or bandwidth mismatch between the M channels, since the T/H circuits may not be exactly the same for the M channels. Timing and bandwidth mismatches can be very difficult to measure and address, especially at high speeds.

A different approach is to use a single or dedicated T/H circuit for multiple time-interleaved ADCs so as to avoid timing and/or bandwidth mismatches between the channels.

FIG. 1 shows a track and hold circuit driving M ADCs of a time-interleaved ADC, according to some embodiments of the disclosure. FIG. 1 shows a T/H circuit 104 driving M ADCs operating in a time-interleaved fashion, shown as Slice $102_1$, Slice $102_2$, ... Slice $102_M$ of a time-interleaved ADC, according to some embodiments of the disclosure. In this example, the T/H can operate at sample rate $f_s$ (or the full-speed of the time-interleaved ADC), while each slice can operate operating at a slower rate, such as $f_s/M$. The output of the T/H circuit 104 is a held signal, and each slice is driven by the same held signal. Therefore, the effect of timing and bandwidth (BW) mismatches between the slices can be eliminated.

A fast T/H circuit can be non-trivial to design. High speed T/H circuits can, in some cases, suffer from very high power consumption, high noise, and low performance. The choice to use a faster T/H circuit to drive multiple ADC slices is a deliberate decision between what to optimize in the analog circuit and what to fix with calibration. Since timing and/or bandwidth mismatch is difficult to address, the T/H circuit and the rest of the ADC can be designed to avoid timing and/or bandwidth mismatch problems. Gain and offset mismatches can be more compatible with calibration. Various T/H circuits described herein were designed to facilitate digital calibration of gain and offset mismatches while avoid timing and bandwidth mismatch problems through deliberate analog circuit design.

Herein, the implementations of the T/H circuits are illustrated in single-ended form. In practice, the T/H circuits can be implemented differentially to suppress possible even-order harmonics.

Improved Track and Hold Circuits Allowing Dither Injection

Because a full-speed T/H circuit can be complex and power hungry, certain design decisions were made to ensure the T/H circuit can achieve target performance while not consuming too much power. One way to achieve better performance out of a circuit is to use calibration to linearize the T/H circuit. To allow for calibration, the T/H circuit is designed to incorporate the injection of additive and multiplicative dither into the T/H circuit to enable the calibration of the circuitry downstream from where the dither is injected.

For instance, the calibration of the circuitry can include extracting and calibrating for the non-idealities in the T/H circuit based on the additive dither and/or multiplicative dither.

Furthermore, calibration can include extracting and calibrating the offset and gain mismatches between the slices. For instance, adding pseudo-random signal (dither) to the input signal enables the calibration of gain mismatch in time-interleaved ADCs. In addition, the dither can be used to calibrate the T/H circuit non-linearity and ADC non-linearity. Advantageously, additive dither in the T/H circuit can:

Enable non-linear calibration of the T/H circuit's hold phase non-linearity:
  Lower power in T/H circuit,
  Better second harmonic (HD2) and third harmonic (HD3) performance, and
  Simpler switches=>lower power in clocking,
Enable non-linear calibration of the ADC slices' non-linearity:
  Lower power in the ADC slices (e.g., reference buffer, amplifiers, etc.),
  Lower power in the clocking and switching, and
  Better HD2, HD3 performance in the ADC slices',
Enable interleaving gain mismatch calibration in the ADC slices:
  Insensitive to the presence of input signal,
  Insensitive to the input signal frequency, and
  More robust calibration, and
Dither the hold phase spurs.

Furthermore, multiplicative dither (e.g., random chopping) can be used to calibrate offsets and offset mismatches. Advantageously, multiplicative dither in the T/H circuit can:
  Enable robust calibration of offset mismatch between the ADC slices:
    Independent of the input signal, and
    Insensitive to "bad" frequencies (e.g., $f_s/M$, M is the number of ADC slices),
  Protect the direct current (DC) input from being zeroed out,
  Dither any remaining offsets, flicker noise, offset mismatch, thermal drifts, etc., and
  Obviate the need for core randomization for offset mismatch.

The additive dither can be injected to correct for one or more of the following: calibration of non-linearity, calibration of memory effects, calibration of chopping non-idealities, calibration of gain error, calibration of gain mismatch in interleaved ADCs, and calibration of track/sampling memory. The multiplicative dither can be used for one or more of the following: correct for offset mismatch and correct for even-order distortion.

Figure 2:
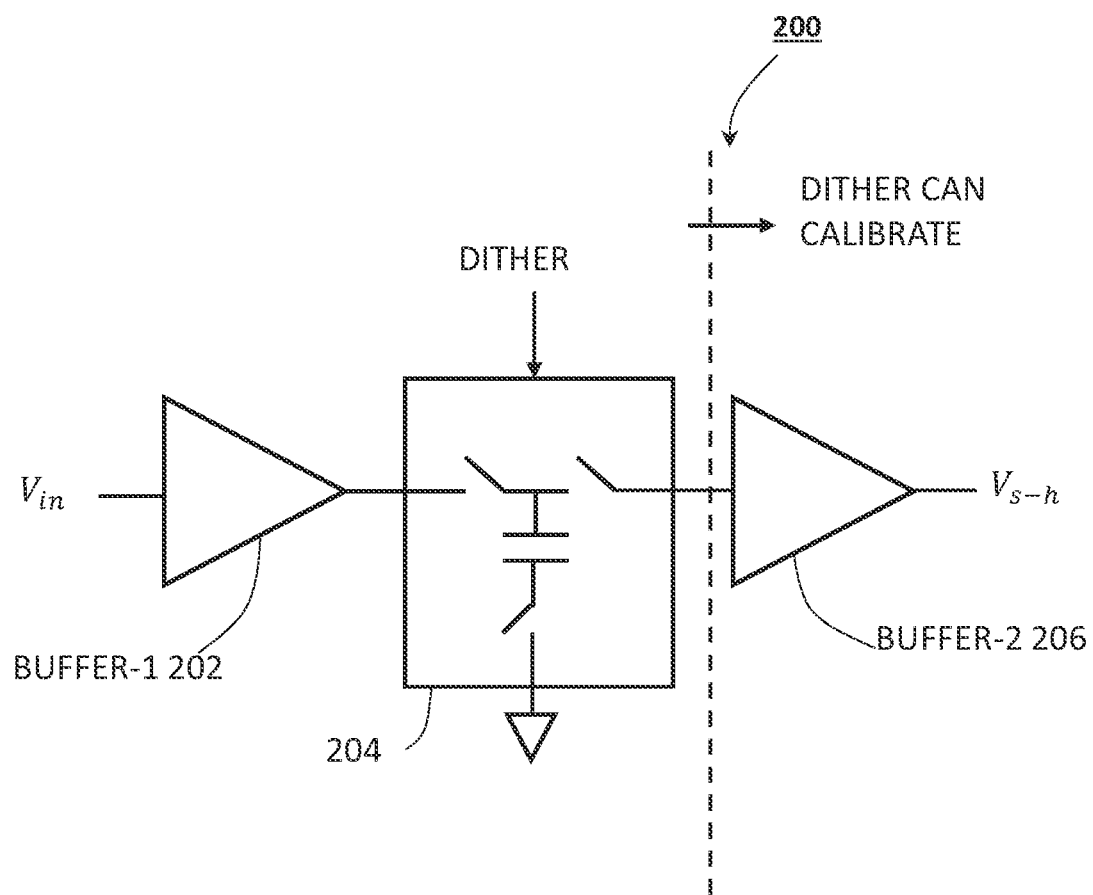
FIG. 2 shows an exemplary track and hold circuit having two buffers and a switched-capacitor network in between, according to some embodiments of the disclosure.

FIG. 2 shows an exemplary T/H circuit 200 having two buffers, Buffer-1 202, and Buffer-2 206, and a switched-capacitor network 204 in between the two buffers, according to some embodiments of the disclosure. Dither can be injected in the switched-capacitor network 204, and the dither can be used to calibrate the Buffer-2 206 and the ADC following the T/H circuit 200. As mentioned before, the dither can be an additive dither or a multiplicative dither. The Buffer-1 202 receives the (voltage) input Vin, and buffers the input. The buffered input can be sampled on the switched-capacitor network 204. For instance, the switched-capacitor network 204 can sample the buffered input onto capacitor using suitable switches. The Buffer-2 206 can buffer the sampled input and provided the held signal $V_{s-h}$ to an ADC (not shown in FIG. 2).

The T/H circuit 200 can be seen as an open-loop T/H circuit. The switched-capacitor network 204 can be a sampling network. Buffer-1 202 can be a sampling buffer, and Buffer-2 206 can be a hold buffer. The buffers are optional, and can be included to provide isolation between different circuit stages. The buffers can be source followers, emitter followers, push pull topology, or any other suitable buffer structure. Buffer-1 202 can be optimized for sampling linearity. Buffer-2 206 can be optimized for low-power, small size, small input capacitance, and good isolation. Isolation for Buffer-2 206 can help reduce input-referred noise of the ADC which follows the T/H circuit 200. The linearity of Buffer-2 206 is not as critical as the linearity of Buffer-1202 because Buffer-2 206 handles and buffers a held signal. In addition, since dither is injected in the switched-capacitor network 204, the non-linearity of the Buffer-2 206 can be calibrated, which helps further lower the power and size of Buffer-2 206. In addition, the gain and offset mismatches between the ADC slices driven by the T/H circuit can be calibrated by injecting a dither in the switched-capacitor network 204. Different gains of the ADC slices can be measured with a dither injected in the shared T/H circuit 200 driving the ADC slices.

One insight of the three-part circuit design of the T/H circuit comes from realizing how to reduce the power consumption of a T/H circuit that has to drive M ADC slices. In the past, an input buffer has to drive M ADC slices, and an input buffer has to be very linear and is likely to consume a lot of power. With the three-part circuit design seen in FIG. 2, the sampling buffer (Buffer-1 202) only needs to drive one sampling network (or, in some cases, 2 to 4 sampling networks depending on the implementation). The (capacitive) load on the sampling buffer can be smaller, and therefore the sampling buffer can consume less power while achieving comparable or better performance, even if the sampling buffer has sample a radio frequency (RF) or high frequency signal. The hold buffer (Buffer-2 206) is driving a held signal, and any problems with the hold buffer can be more benign. The primary requirement for the hold buffer is how well the output of the hold buffer settles. Also, the hold buffer has no input frequency sensitivity. Even though the hold buffer may have to drive M ADC slices, the linearity of the hold buffer is not extremely critical since the hold buffer can be calibrated with the dither being injected in the sampling network. Therefore, power savings can still be achieved.

Track and Hold Circuit with Amplification

Figure 3:
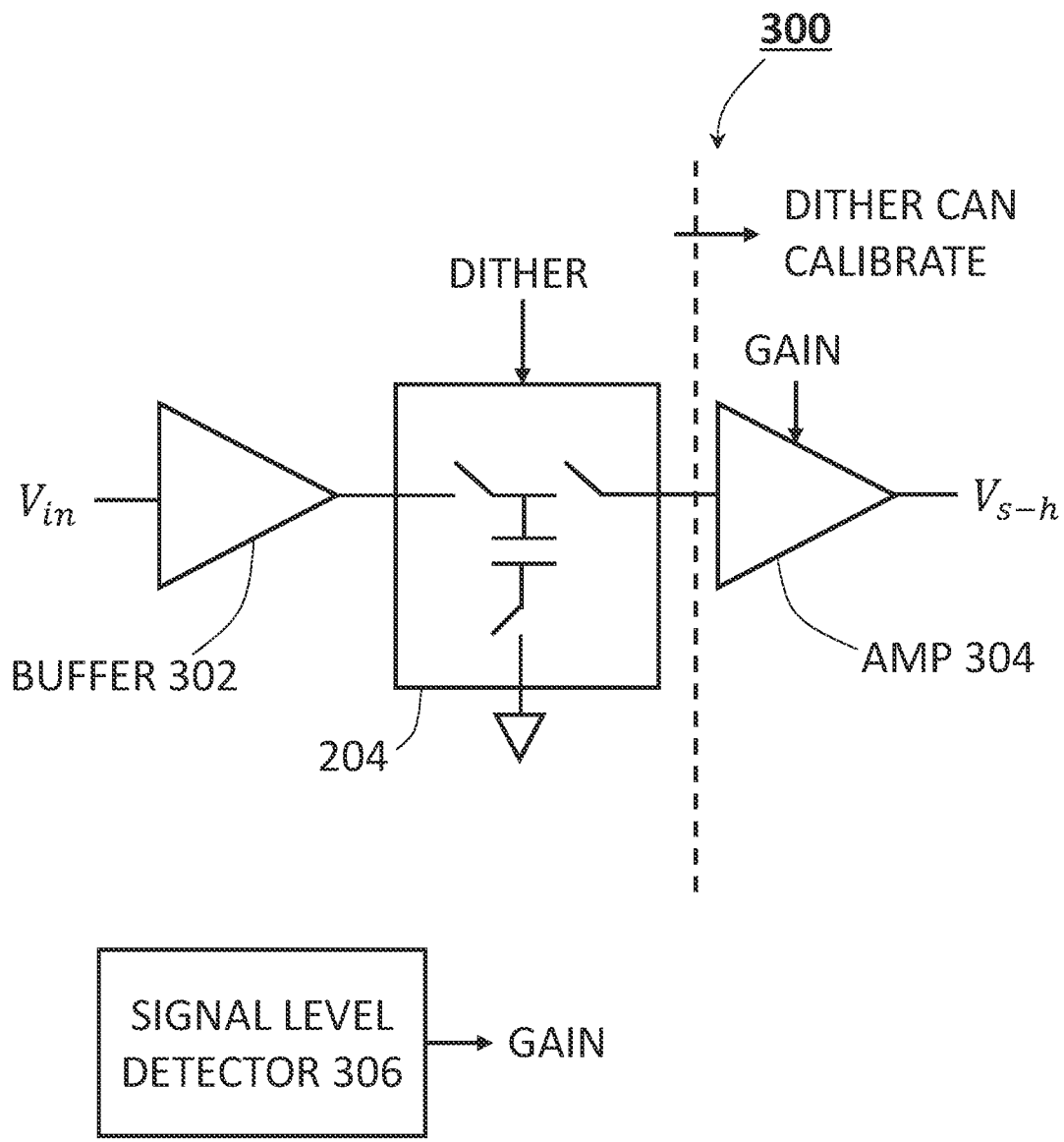
FIG. 3 shows an exemplary track and hold circuit having a buffer, a switched-capacitor network, and an amplifier, according to some embodiments of the disclosure.

Typically for high speed ADCs, amplification is not available in the input circuitry because open-loop amplification can be very non-linear. FIG. 3 shows an exemplary T/H circuit 300 having a buffer 302, a switched-capacitor network 204, and an amplifier 304, according to some embodiments of the disclosure. Comparing the T/H circuit 300 with the T/H circuit 200 of FIG. 2, buffer 302 can be similar to Buffer-1202, but Buffer-2 206 is replaced by amplifier 304. Since the amplifier 304 can be an open-loop amplifier, amplifier 304 is likely to suffer from poor linearity. By virtue of having dither injection in the switched-capacitor network 204, the amplifier 304 can be calibrated and any possible non-linearities associated with the amplifier 304 can be addressed. The ability to provide amplification in the T/H circuit 300 is advantageous since it greatly relaxes the requirements on the input signal being provided to the T/H circuit 300. Besides, the amplifier 304 can, just like the Buffer-2 206 of FIG. 2, reduce input-referred noise of the ADC which follows the T/H circuit 300.

Besides providing amplification, the amplifier 304 can be a VGA or provide variable gain. The gain can be varied based on one or more conditions and/or set by one or more specified parameters. A gain control signal "GAIN" can be used to vary the gain provided by amplifier 304.

In some embodiments, a signal level detector 306 can be implemented to generate the gain control signal "GAIN" to control the amplifier 304 based on signal level conditions. For instance, if the signal level detector 306 detects an overload condition (e.g., a very large input signal Vin), the signal level detector 306 can generate an appropriate gain control signal "GAIN" to reduce the gain of the amplifier 304.

Although not shown as an amplifier, buffer 302 can be implemented as an amplifier in some cases. The amplifier in place of buffer 302 can be a variable gain amplifier (e.g., controllable by signal level detector 306). Depending on the implementation, the amplifier is an open-loop amplifier, or a closed-loop amplifier. A closed-loop amplifier may be preferred since they can be more accurate than an open-loop amplifier. In some cases, buffer 302 can be preceded by a separate amplifier (open-loop or closed-loop). Amplification at the sampling side can also relax the requirements on the input signal being provided to the T/H circuit 300.

It is understood that the various embodiments shown herein with a hold buffer such as "Buffer-2" can be replaced with an amplifier 304 as illustrated by FIG. 3.

It is possible that that the various embodiments shown herein with sampling buffer(s) can be replaced with an amplifier or a variable gain amplifier. However, linearity for such amplifier can be critical, and the amplifier may need to be calibrated or linearized using an appropriate calibration scheme. In a similar fashion, a signal level detector can be used to adjust the gain of such variable gain amplifier.

Sampling Network with Dither Injection

Dither can be injected into a node of the switched-capacitor network of the T/H circuit through different circuit topologies described herein. A dither is a random signal. A dither can have different levels. In one example, a dither can be generated by a digital-to-analog converter receiving a digital input (the dither in digital form) and generating an analog output (the dither in analog form). The analog output from the digital-to-analog converter can be injected into the switched-capacitor network of a T/H circuit. In some cases, a dither can randomly change between positive or negative (e.g., randomly changing between +1, and −1, or +V or −V where V is a nominal value). The type of dither being injected can differ depending on the desired calibration to be performed or effect to be achieved.

Figure 4:
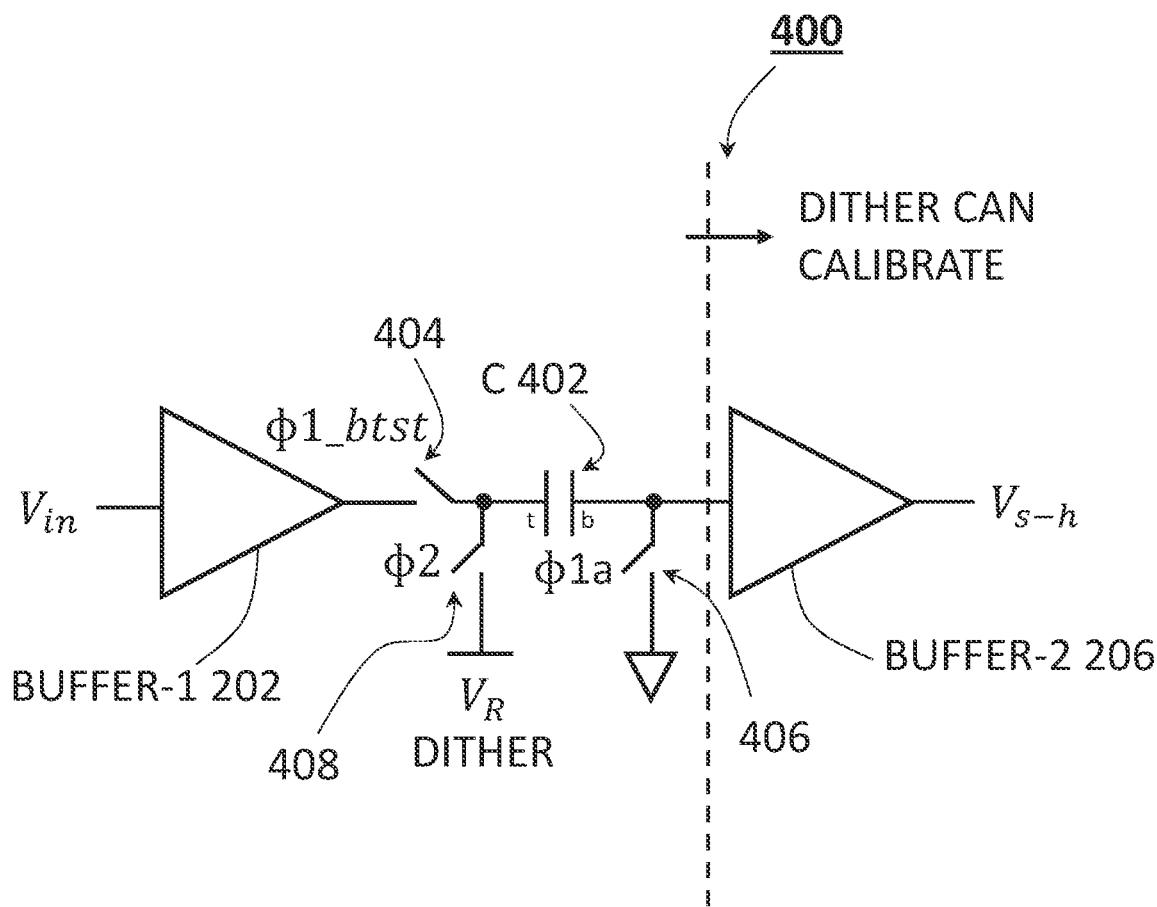
FIG. 4 shows an exemplary track and hold circuit illustrating one exemplary switched-capacitor network with sampling and dither injection, according to some embodiments of the disclosure.

FIG. 4 shows an exemplary T/H circuit 400 illustrating one exemplary switched-capacitor network with sampling and dither injection, according to some embodiments of the disclosure. Dither is injected in the switched-capacitor network at node $V_R$ and can be used to calibrate Buffer-2 206 and the ADC following the T/H circuit 400. The switched-capacitor network has capacitor C 402 for sampling the input, an input switch 404 for receiving the (buffered) input from Buffer-1 202, a sampling switch 406, and a dither injection switch 408. In the FIGURES, various phase φ symbols adjacent to the switches indicate a phase or timing indicating when a given switch is closed. Top and bottom plates of capacitor C is indicated as "t" and "b" respectively.

During sample phase, the input switch 404 having phase φ1_btst and the sampling switch 406 having phase φ1a are closed. The input switch 404 can be a bootstrapped switch (i.e., bootstrapped to the buffered input) to achieve good linearity. The sampling switch having phase φ1a 406 is advanced (opens before the input switch 404 is opened) to achieve bottom plate sampling. The dither injection switch 408 having phase φ2 is opened during the sample phase. At the end of the sample phase, the input signal is sampled onto capacitor C 402.

During a hold phase, both the input switch 404 having phase φ1_btst and the sampling switch 406 having phase φ1a are opened. Dither injection switch 408 having phase φ2 closes to connect the top plate of the capacitor C 402 to the node $V_R$. Accordingly, additive dither can be injected in the switched-capacitor network. The T/H circuit 400 holds the sampled voltage (the sampled input signal), plus the additive dither injected, at the output as $V_{s-h}$. In this embodiment, the output bias point of Buffer-1 202 does not need to be compatible with the input bias point of Buffer-2 206. The output $V_{s-h}$ in FIG. 4 is an inverted version of the input in plus the additive dither injected at node $V_R$.

Figure 5:
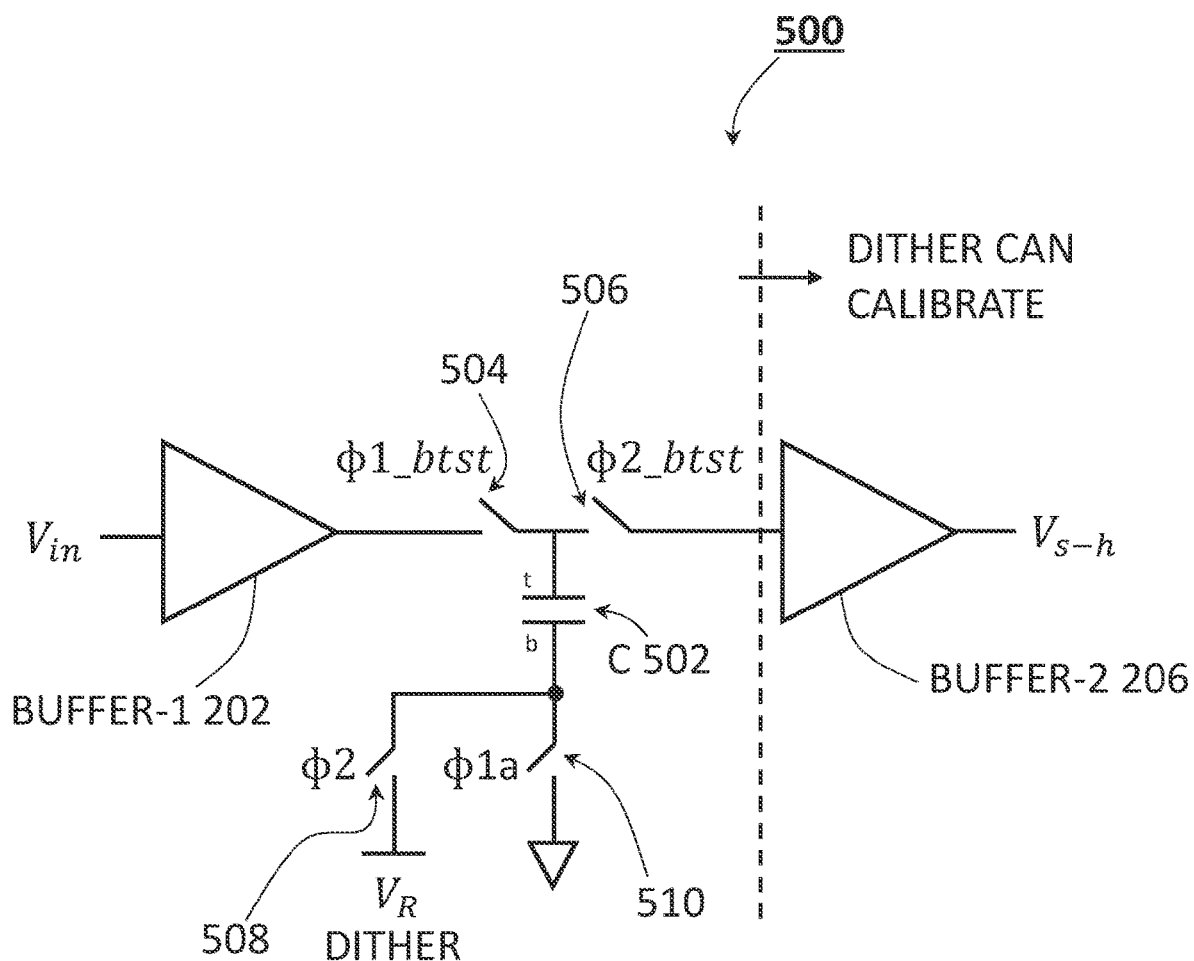
FIG. 5 shows an exemplary track and hold circuit illustrating another exemplary switched-capacitor network with sampling and dither injection, according to some embodiments of the disclosure.

FIG. 5 shows an exemplary T/H circuit 500 illustrating another exemplary switched-capacitor network with sampling and dither injection, according to some embodiments of the disclosure. Similar to FIG. 4, additive dither is injected in the switched-capacitor network and can be used to calibrate Buffer-2 206 and the ADC following the T/H circuit 500. The switched-capacitor network has capacitor C 502 for sampling the input, an input switch 504 for receiving the (buffered) input from Buffer-1 202, a sampling switch 510, a dither injection switch 508, and an output switch 506.

During sample phase, the input switch 504 having phase φ1_btst and the sampling switch 510 having phase φ1a are closed. The input switch 504 can be a bootstrapped switch (i.e., bootstrapped to the buffered input) to achieve good linearity. The sampling switch 510 having phase φ1a is advanced (opens before the input switch 504 is opened) to achieve bottom plate sampling. The dither injection switch 508 having phase φ2 and the output switch 506 having phase φ1_btst are opened during the sample phase. At the end of the sample phase, the input signal is sampled onto capacitor C 502.

During a hold phase, both the input switch 504 having phase φ1_btst and the sampling switch 510 having phase φ1a are opened. Dither injection switch 508 having phase φ2 closes to connect the bottom plate of the capacitor C 502 to the node $V_R$. Accordingly, additive dither can be injected in the switched-capacitor network. Output switch 506 having phase φ2_btst also closes to connect the capacitor C 502 to the Buffer-2 206. The output switch 506 can optionally be a bootstrapped switch to achieve good linearity. The T/H circuit 500 holds the sampled voltage (the sampled input signal), plus the additive dither injected, at the output as $V_{s-h}$. In this embodiment, the output bias point of Buffer-1 202 is preferably compatible with the input bias point of Buffer-2 206. The output $V_{s-h}$ is a non-inverted version of the input VW plus the additive dither injected at node $V_R$.

Compared to the T/H circuit 400 in FIG. 4, the T/H circuit 500 can have two bootstrapped switches, which can be more complicated and expensive. However, having the two bootstrapped switches can provide better isolation, and can enable using more than one sampling network (e.g., more than one switched-cap network sampling in an interleaved fashion) with the same Buffer-2 206, if needed, to achieve higher speeds.

Output switch 506 does not have to be bootstrapped, since the dither being injected can be used to calibrate output switch 506. If indeed the output switch 506 is bootstrapped, then calibration may not be needed since the output switch 506 is linear enough.

If the output switch 506 is not bootstrapped (e.g., just boosted), then calibration can be used to address non-linearities of the output switch 506.

Figure 6:
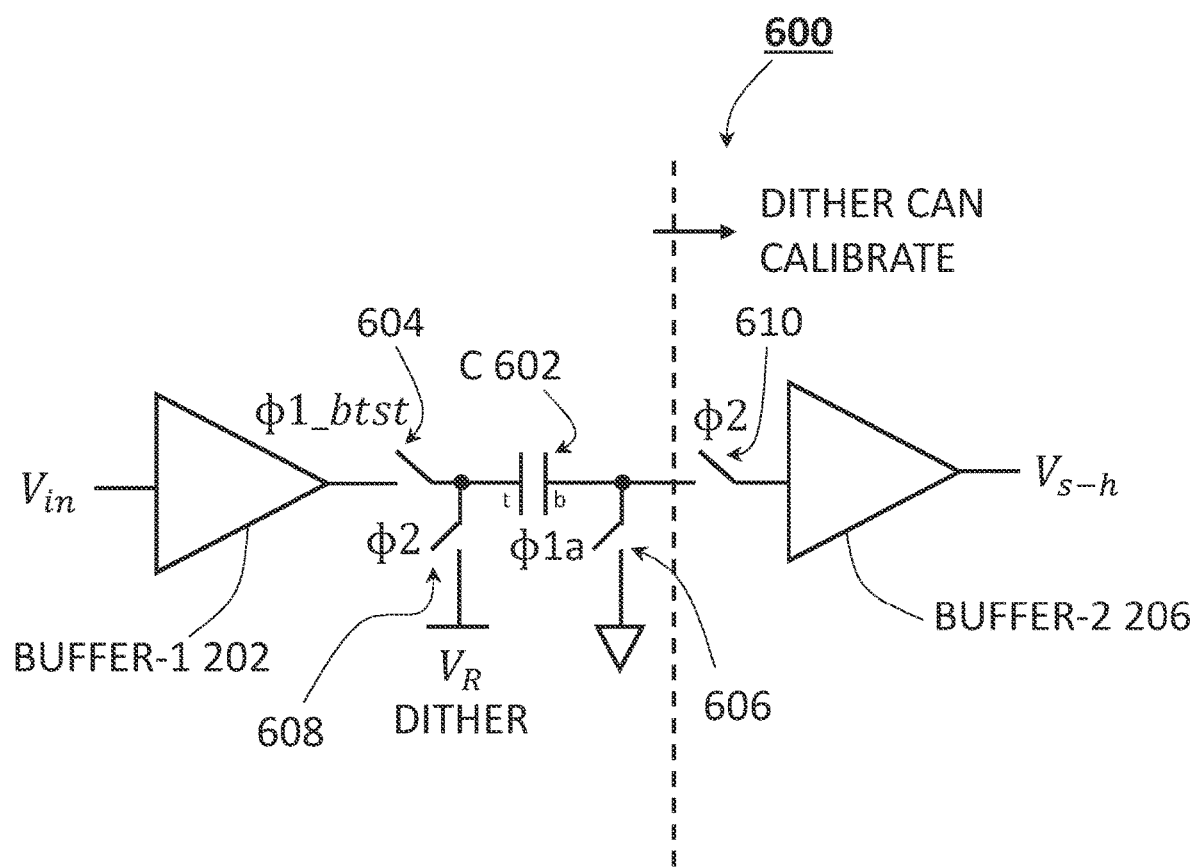
FIG. 6 shows an exemplary track and hold circuit illustrating yet another exemplary switched-capacitor network with sampling and dither injection, according to some embodiments of the disclosure.

FIG. 6 shows an exemplary T/H circuit 600 illustrating yet another exemplary switched-capacitor network with sampling and dither injection, according to some embodiments of the disclosure. Dither is injected in the switched-capacitor network and can be used to calibrate Buffer-2 206 and the ADC following the T/H circuit 600. The switched-capacitor network has capacitor C 602 for sampling the input, an input switch 604 for receiving the (buffered) input from Buffer-1 202, a sampling switch 606, a dither injection switch 608, and an output switch 610. The T/H circuit 600 can be seen as a mix of the T/H circuit 400 of FIG. 4 and T/H circuit 500 of FIG. 5. The sampling is done in a manner similar to FIG. 4, but an additional switch (i.e., the output switch 610) is present in series with the capacitor C 602 to connect the capacitor C 602 during the hold phase and isolate the switched-capacitor network from the Buffer-2 206.

During sample phase, the input switch 604 having phase φ1_btst and the sampling switch 606 having phase φ1a are closed. The input switch 604 can be a bootstrapped switch to achieve good linearity. The sampling switch 606 having phase φ1a is advanced (opens before the input switch 604 is opened) to achieve bottom plate sampling. The dither injection switch 608 having phase φ2 and the output switch having phase φ2 are opened during the sample phase. At the end of the sample phase, the input signal is sampled onto capacitor C 602.

During a hold phase, both the input switch 604 having phase φ1_btst and the sampling switch 606 having phase φ1a are opened. Dither injection switch 608 having phase φ2 closes to connect the top plate of the capacitor C 602 to the node $V_R$. Accordingly, additive dither can be injected in the switched-capacitor network. Output switch 610 having phase φ2 also closes to connect the capacitor C 502 to the Buffer-2 206. In some cases, the output switch 610 can be a bootstrapped switch to achieve good linearity. In some cases, the output switch is not bootstrapped. Bootstrapping the output switch 610 is less critical in this case since the output switch 610 can be calibrated using the additive dither being injected. The T/H circuit 600 holds the sampled voltage (the sampled input signal), plus the additive dither injected, at the output as $V_{s-h}$. In this embodiment, the output bias point of Buffer-1202 does not need to be compatible with the input bias point of Buffer-2 206. The output $V_{s-h}$ is an inverted version of the input VI, plus the additive dither injected at node $V_R$.

Multiplexing Multiple Inputs in the T/H Circuits

As described above, a full-speed T/H circuit can be used to drive a high speed ADC.

The high speed ADC can have a single sampling ADC, or M ADC slices (time-interleaved to achieve higher sampling rate or conversion speeds). In some applications, it can be often desirable to combine multiple input signals into a single ADC to generate multiple digital outputs while minimizing the interference between them. The T/H or input circuits illustrated and envisioned herein can be adapted or configured to include circuitry that allows for spread spectrum and code division multiplexing, such that multiple inputs can be multiplexed or combined together to form a single signal for a quantizer which follows the T/H or input circuits. Besides spread spectrum and code division multiplexing, the T/H or input circuits can be adapted or configured to include circuitry that allows for spatial multiplexing where coding is used to multiplex signals spatially (as opposed to multiplexing signals in the frequency domain). More broadly, the circuitry can allow for various forms of multiplexing that involves coding. As a result, the high speed ADC having the T/H or input circuits, can receive multiple inputs, making it a multi-input ADC. Appropriate coding also means that a multiplexed coded signal can be demultiplexed into multiple signals. As a result the high speed ADC can generate multiple outputs, making it a multi-input, multi-output ADC. The resulting front-end (T/H or input circuits) of the ADC can aggregate multiple input signals, code them, and combine them with minimal power overhead. The ADC can also demultiplex the signals with minimal power overhead.

To accommodate coding, e.g., code division multiplexing or other suitable code-based multiplexing schemes, a T/H circuit or input circuit of a multi-input ADC can multiplex multiple inputs by providing multiple sampling buffers (e.g., Buffer-1's) and multiple switched-capacitor networks. The pairs of sampling buffer and switched-capacitor networks are provided in parallel to process multiple inputs in parallel.

Figure 7:
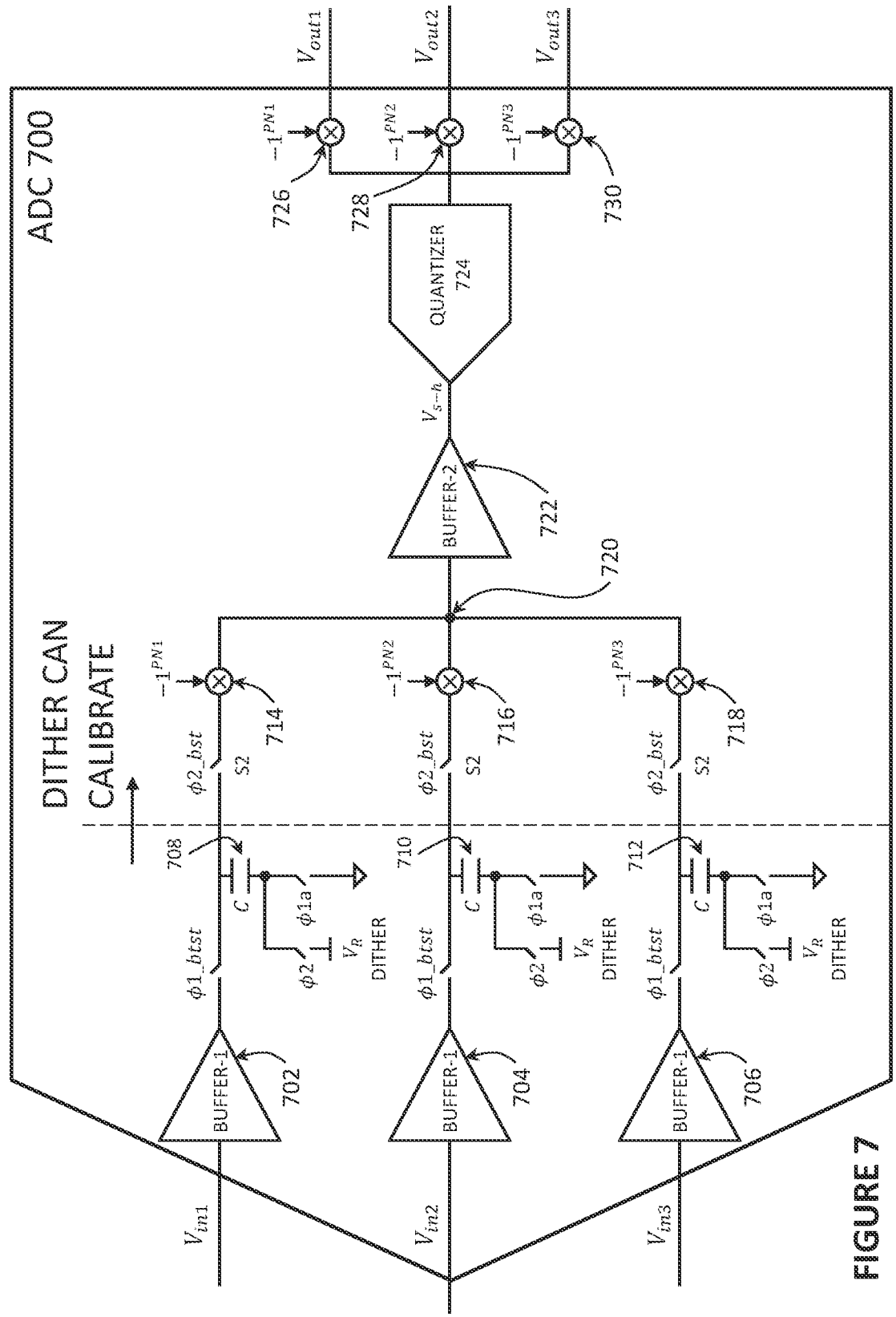
FIG. 7 shows an exemplary multi-input ADC, according to some embodiments of the disclosure.

FIG. 7 shows an exemplary multi-input ADC 700, according to some embodiments of the disclosure. The multi-input ADC 700 has input circuitry that can perform coding and multiplexing, a quantizer 724 to generate a digital output signal based on a multiplexed coded signal at a common node 720, and digital circuitry to demultiplex the digital output signal from the quantizer 724 into separate digital output signals. In this example, the multi-input ADC 700 can receive and multiplex N inputs, e.g., three inputs $V_{in1}$, $V_{in2}$, and Vin in this FIGURE. In this example, N is 3 (i.e., the multi-input ADC receives 3 inputs), but it is understood by one skilled in the art that the multi-input ADC 700 (or other multi-input ADCs described herein) can be configured to receive other number of inputs (having other values of N).

The overall T/H or input circuit for the multi-input ADC 700 can be seen as a split T/H structure where a portion of the T/H circuit is split into N parallel paths. The sampling buffer of the T/H circuit is split/expanded into N=3 parallel buffers, e.g., Buffer-1702, Buffer-1704, and Buffer-1706. The T/H circuit also has N=3 parallel switched-capacitor networks. Note that the sampling network of the T/H circuit is also split/expanded into N=3 parallel switched-capacitor networks. The N parallel switched-capacitor networks have N parallel capacitances, e.g., C 708, C 710, and C 712. In this example, the parallel switched-capacitor networks utilize the circuit structure seen in FIG. 5, it is understood that other switched-capacitor circuit topologies for sampling the signal from the Buffer-1's can be used (e.g., one seen in FIG. 4 or FIG. 5, or other T/H circuits described herein).

The parallel sampling buffers, i.e., Buffer-1 702, Buffer-1 704, and Buffer-1 706, can be optional. The parallel sampling buffers can buffer respective input signals before the respective buffered input signals are sampled onto the respective sampling capacitors in the parallel switched-capacitor networks.

The signals in the N parallel paths formed by the N parallel switched-capacitor networks are combined through capacitive charge redistribution of the parallel capacitances, e.g., C 708, C 710, and C 712. In other words, the N sampled signals in the N switched-capacitor networks are summed (and optionally scaled down appropriately) at common node 720 through charge redistribution. Charge redistribution occurs when the parallel capacitances (i.e., the sampling capacitors in the parallel switched-capacitor networks) are connected together in parallel by the common node 720. The signal at the common node 720, through charge redistribution, would become a signal that is representative of a combination of charges on the parallel capacitances. Accordingly, the signals on the N parallel paths are combined together at the common node 720.

Optionally, the combined signal at common node 720 is buffered by a single hold buffer, i.e., Buffer-2 722. The output of Buffer-2 722, e.g., $V_{s-h}$, is provided as input to quantizer 724 for conversion. The quantizer 724 generates a digital output signal based on a multiplexed coded signal at the common node 720.

To multiplex multiple signals and to demultiplex the multiplexed signal later on, N code sequences can be used to code respective N inputs. For instance, orthogonal pseudo-random number (PN) sequences can be particularly useful for spread spectrum and code divisional multiplexing targeted to multiplex signal in the frequency domain. Accordingly, each parallel switched-capacitor network comprises a circuit for coding a respective input signal using a respective orthogonal pseudo-random number sequence and generating coded input signals. The parallel switched-capacitor networks can then combine coded input signals at a common node through charge redistribution of sampling capacitors in the parallel switched-capacitor networks to generate a multiplexed coded signal. Generally, different coding schemes can be used, depending on the application. Exemplary suitable coding schemes include: Walsh, PN, spatial multiplexing, etc.

One way to perform coding on the respective N inputs is to use a chopper circuit. The chopper circuit is integrated in a switched-capacitor network. In the example shown, N parallel chopper circuits, e.g., chopper 714, chopper 716, and chopper 718, perform coding in the hold phase. In this example, the chopper circuit is controlled by a respective orthogonal PN sequence, which can code the respective input accordingly. The chopper circuit can be integrated with a switch controlled by φ2_bst (an output switch of the switched-capacitor circuit) to swap a polarity of a differential signal based on the phase φ2_bst and the value of the orthogonal PN sequence. The chopper circuit can be controlled by a suitable code sequence for performing code-based multiplexing.

Figure 8:
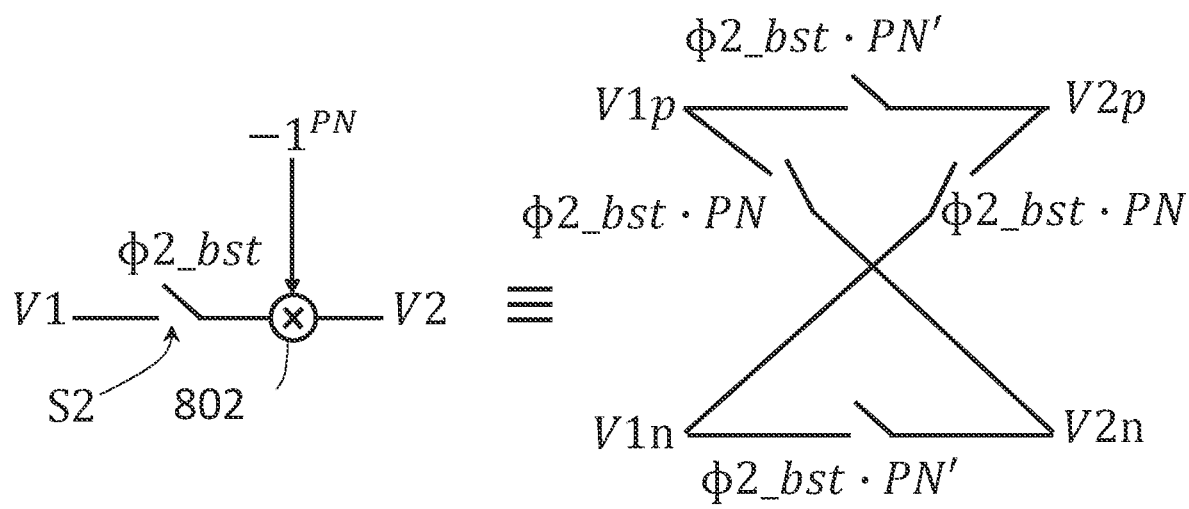
FIG. 8 shows circuitry for implementing coding using a chopper, according to some embodiments of the disclosure.

FIG. 8 shows circuitry for implementing coding using a chopper, according to some embodiments of the disclosure. The chopper 802, e.g., controlled by an orthogonal PN sequence, can swap differential signal paths of a signal based on the value of the orthogonal PN sequence. An exemplary orthogonal PN sequence can have a sequence of values comprising 0's and 1's. A chopper's function is equivalent to multiplying an analog signal by $-1^{PN}$, where PN is the value of the orthogonal PN sequence. This means that the chopper 802 multiplies the signal by 1 or −1. The chopper 802, when integrated with a switch controlled by φ2_bst swaps polarity of a differential signal based on the phase φ2_bst and the value of the orthogonal PN sequence.

When the chopper 802 multiplies the signal by $-1^0=1$ (PN=0), the polarity of the differential signal is maintained. When the chopper 802 multiplies the signal by $-1^1=1$ (PN=1), the polarity of the differential signal is swapped. A circuit equivalent to the switch controlled by phase φ2_bst and a chopper 802 controlled by orthogonal PN sequence PN (equivalent to multiplying a signal by $-1^{PN}$) is shown on the right hand side of FIG. 8. φ2_bst and the PN value together controls a pair of switches (controlled by φ2_bst·PN') which passes the differential signal through without swapping polarity and a pair of switches (controlled by φ2_bst ·PN) which swaps the differential signal paths to swap the polarity.

The same/corresponding code sequences, e.g., N orthogonal PN sequences, can be used to decode or demultiplex the signals at the output of quantizer 724. The quantizer 724 converts the combined held signal $V_{s-h}$ (comprising a combination/sum of the N coded input signals multiplexed together) into a digital output. The digital output can be provided to N parallel decoders, e.g., decoder 726, decoder 728, decoder 730, so that the N inputs can be separated or demultiplexed. In the digital domain, the same N orthogonal PN sequences used for coding the signals are used to separate the N signals. A decoder can change the polarity of the digital signal digitally (e.g., by flipping a sign bit) based on the value of the PN sequence. A decoder is equivalent to multiplying a digital signal by $-1^{PN}$, where PN is the value of the orthogonal PN sequence. N digital outputs, e.g., $V_{out1}$, $V_{out2}$, and $V_{out3}$, can be obtained at the output of the multi-input, multi-output ADC.

Depending on the multiplexing scheme, other special code sequences such as Space-Time codes can be used with the chopper to code the analog input signals in the channels.

The same special code sequences or corresponding code sequences can be used to demultiplex/separate the signals in the digital domain. For instance, other special code sequences can be designed to implement spatial multiplexing to code the analog input signals in the space and time dimension.

The sampled and held voltage $V_{s-h}$ his given by:

$$V_{s-h}=G(V_{in1'}-1^{PN1}+V_{in2'}-1^{PN2}+V_{in3'}-1^{PN3}+ \ldots +V_{inN'}-1^{PNN}) \quad (eq.1)$$

where:

$$G = \frac{C}{NC + C_p} \quad (eq.\ 2)$$

C is the unit capacitance of the parallel capacitances, N is the number of inputs and $C_p$ is the parasitic capacitance at the input of the second/hold buffer. The gain factor or scaling factor G is a result of charge redistribution occurring in various capacitances in the input circuitry.

Figure 9:
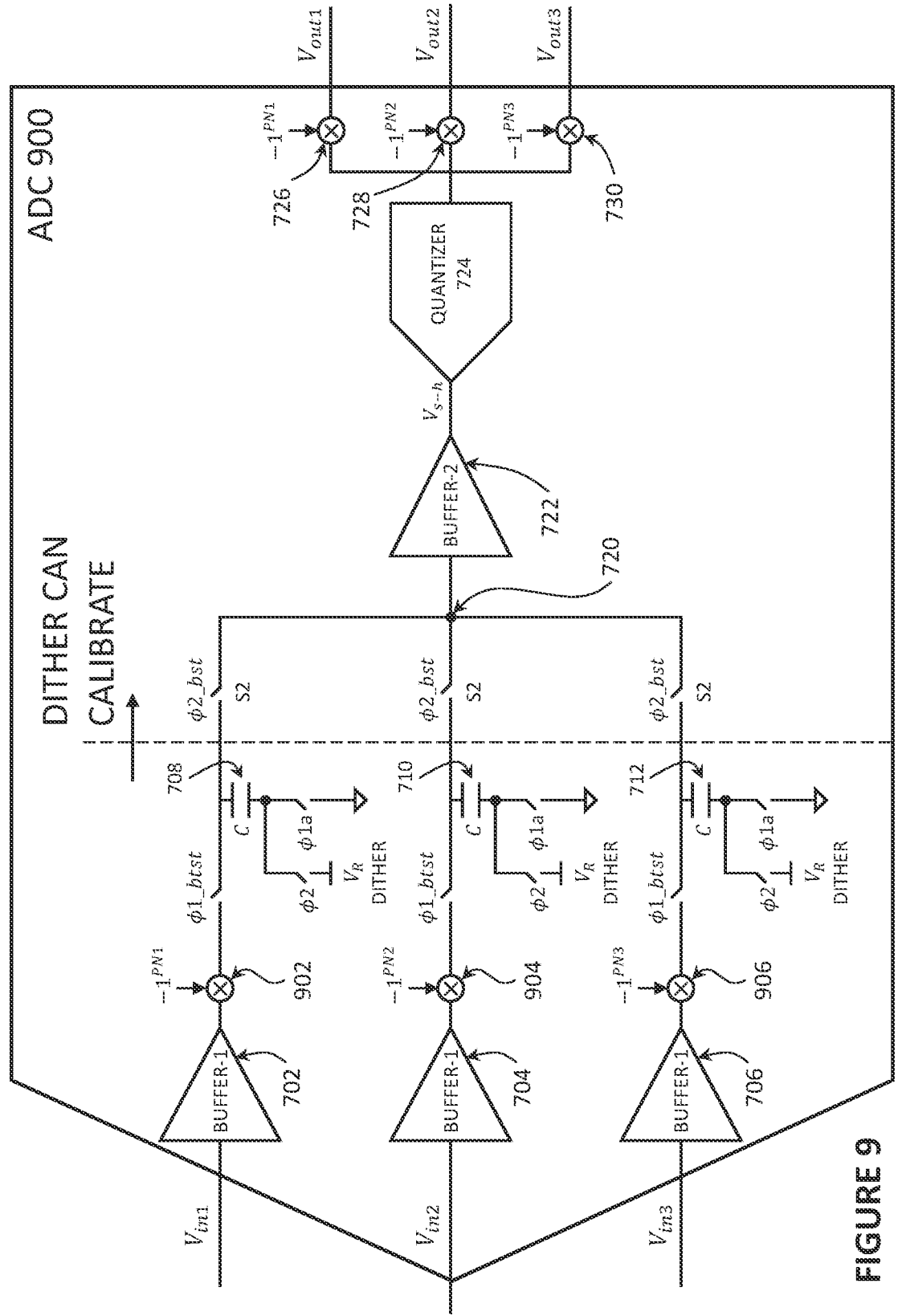
FIG. 9 shows another exemplary multi-input ADC, according to some embodiments of the disclosure.

In some cases, the chopper circuits are included at the output of the sampling buffers (e.g., Buffer-1's) instead of the input of the hold buffers. Such chopper circuits would perform coding in the sample phase instead. FIG. 9 shows another exemplary multi-input ADC 900, according to some embodiments of the disclosure. In the example shown, N parallel chopper circuits, e.g., chopper 902, chopper 904, and chopper 906, perform coding in the sample phase. The chopper circuit is controlled by, e.g., a respective orthogonal PN sequence, which can code the input accordingly. Same as before in FIG. 7, the chopper's function is equivalent to multiplying an analog signal by $-1^{PN}$, where PN is the value of the orthogonal PN sequence. The chopper circuit can be integrated with a switch controlled by φ1_btst (an input switch of the switched-capacitor circuit) to swap a polarity of a differential signal based on the phase φ1_btst and the value of the orthogonal PN sequence.

Figure 10:
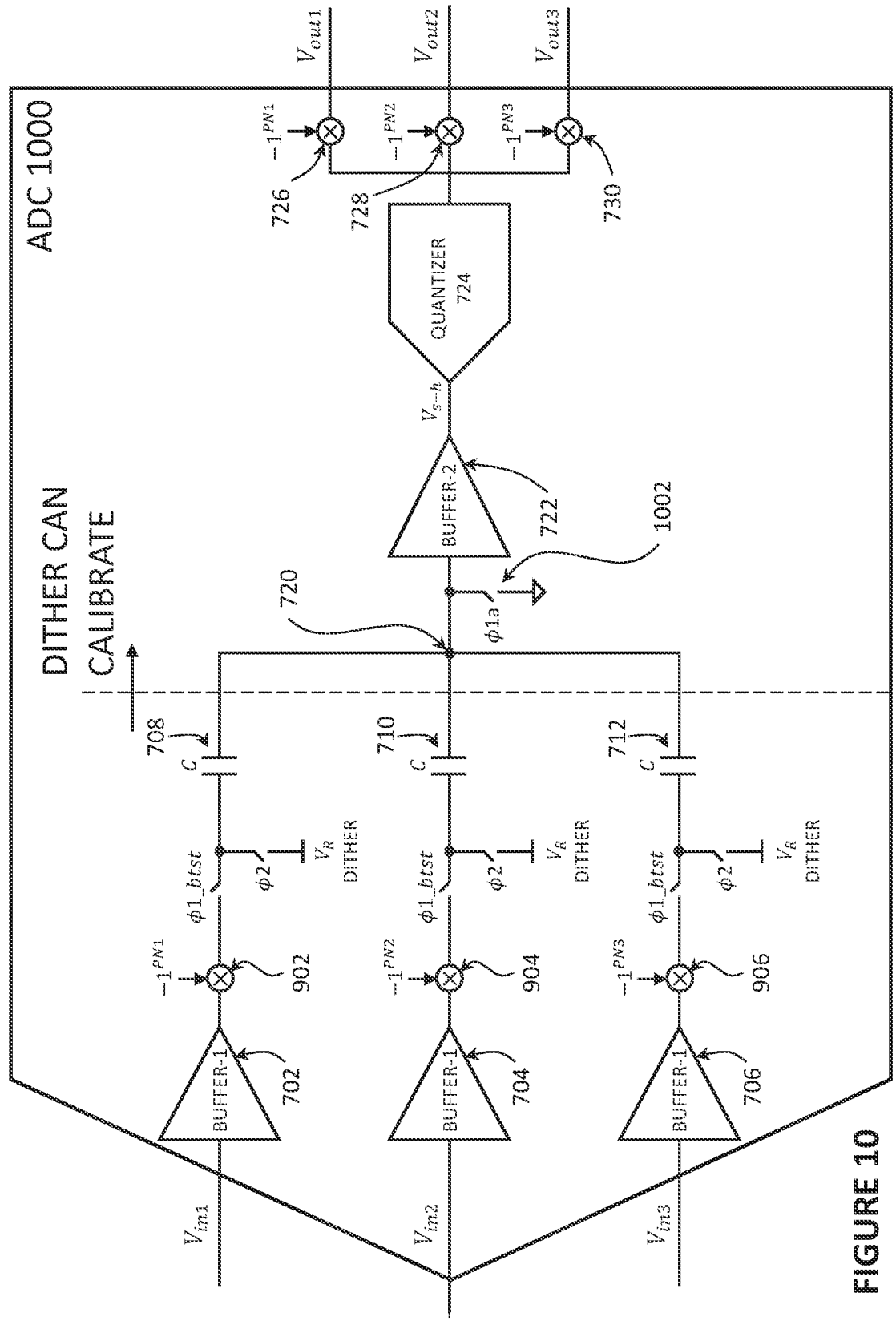
FIG. 10 shows yet another exemplary multi-input ADC, according to some embodiments of the disclosure.

FIG. 10 shows yet another exemplary multi-input ADC 1000, according to some embodiments of the disclosure. Like FIG. 9, the chopping/coding is performed in the sample phase, where the chopper circuits e.g., chopper 902, chopper 904, and chopper 906, are located at the output of the sampling buffers, e.g., Buffer-1 702, Buffer-1, 704, and Buffer-1 706. The chopper circuit can be integrated with a switch controlled by φ1_btst (an input switch of the switched-capacitor circuit) to swap a polarity of a differential signal based on the phase φ1_btst and the value of the orthogonal PN sequence. The circuitry seen in FIG. 10 utilizes the circuit topology illustrated by the T/H circuit in FIG. 4, and can reduce the number of switches needed to implement the switched-capacitor networks (can have less switches than the structures seen in FIGS. 7 and 9). In particular, the common node 720 in FIG. 10 represents a node connecting to all of the bottom plates of parallel sampling capacitances 708, 710, and 720. One single bottom plate switch 1002 is needed (as opposed to one per channel) to perform bottom plate sampling.

Figure 11:
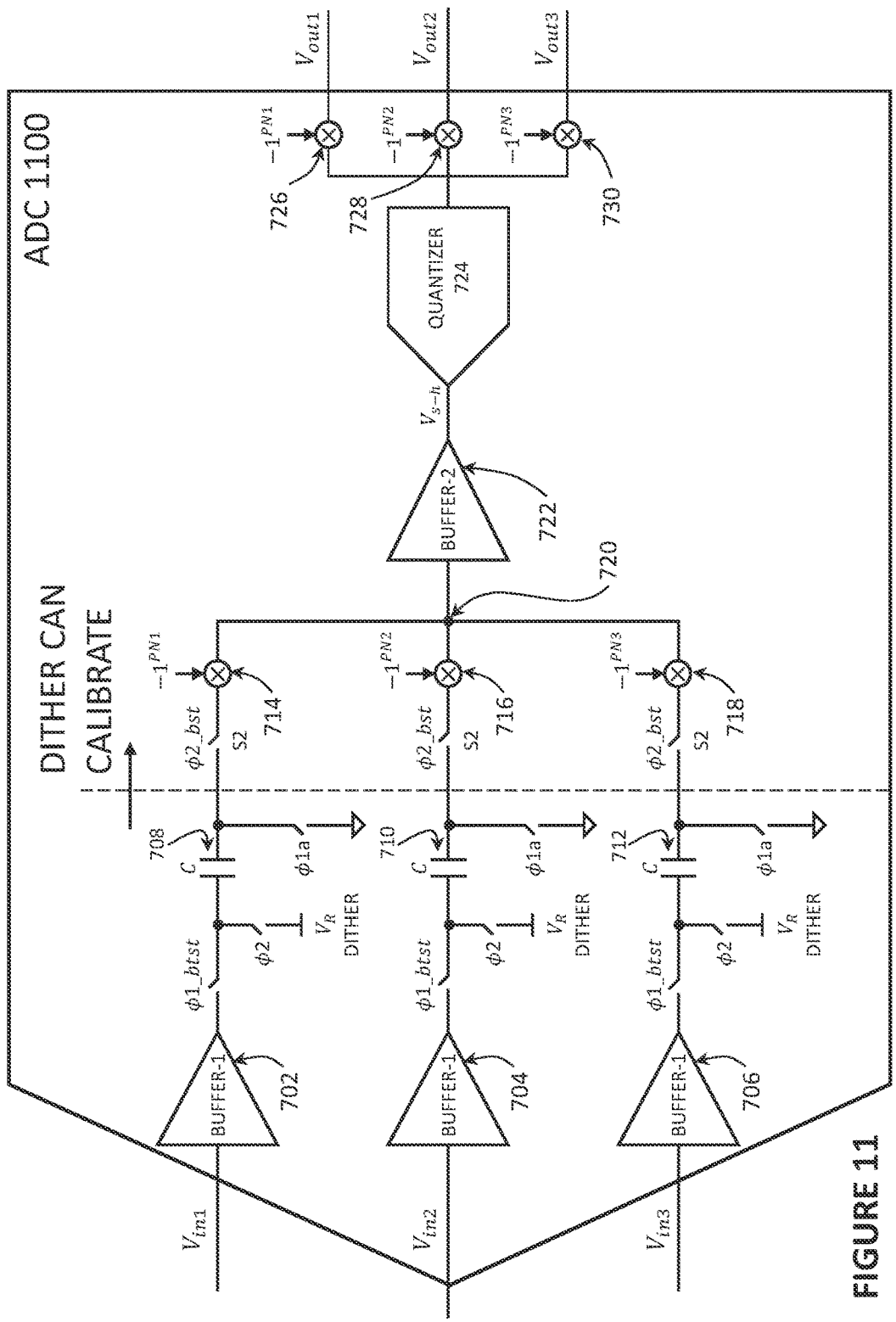
FIG. 11 shows a further exemplary multi-input ADC, according to some embodiments of the disclosure.

FIG. 11 shows a further exemplary multi-input ADC 1100, according to some embodiments of the disclosure. Like FIG. 7, the chopping/coding is performed in the hold phase, where the chopper circuits e.g., chopper 714, chopper 716, and chopper 718, are located at the input of the hold buffer, e.g., Buffer-2 722. The chopper circuit can be integrated with a switch controlled by $\phi2\_bst$ (an output switch of the switched-capacitor circuit) to swap a polarity of a differential signal based on the phase $\phi2\_bst$ and the value of the orthogonal PN sequence. In the configuration shown in FIG. 11, the switched-capacitor networks implements inverted sampling (i.e., the sampled value is inverted) and bottom plate sampling. Switches labeled S2 (e.g., output switches of the parallel switched-capacitor circuits) can be used for isolation, and are optional.

Depending on the application, the circuitry for coding the multiple signals can leverage any one or more of the T/H circuits illustrated in the various FIGURES herein and other variations of the T/H circuits envisioned by the disclosure.

Time-Interleaving within a Parallel Channel

Figure 12:
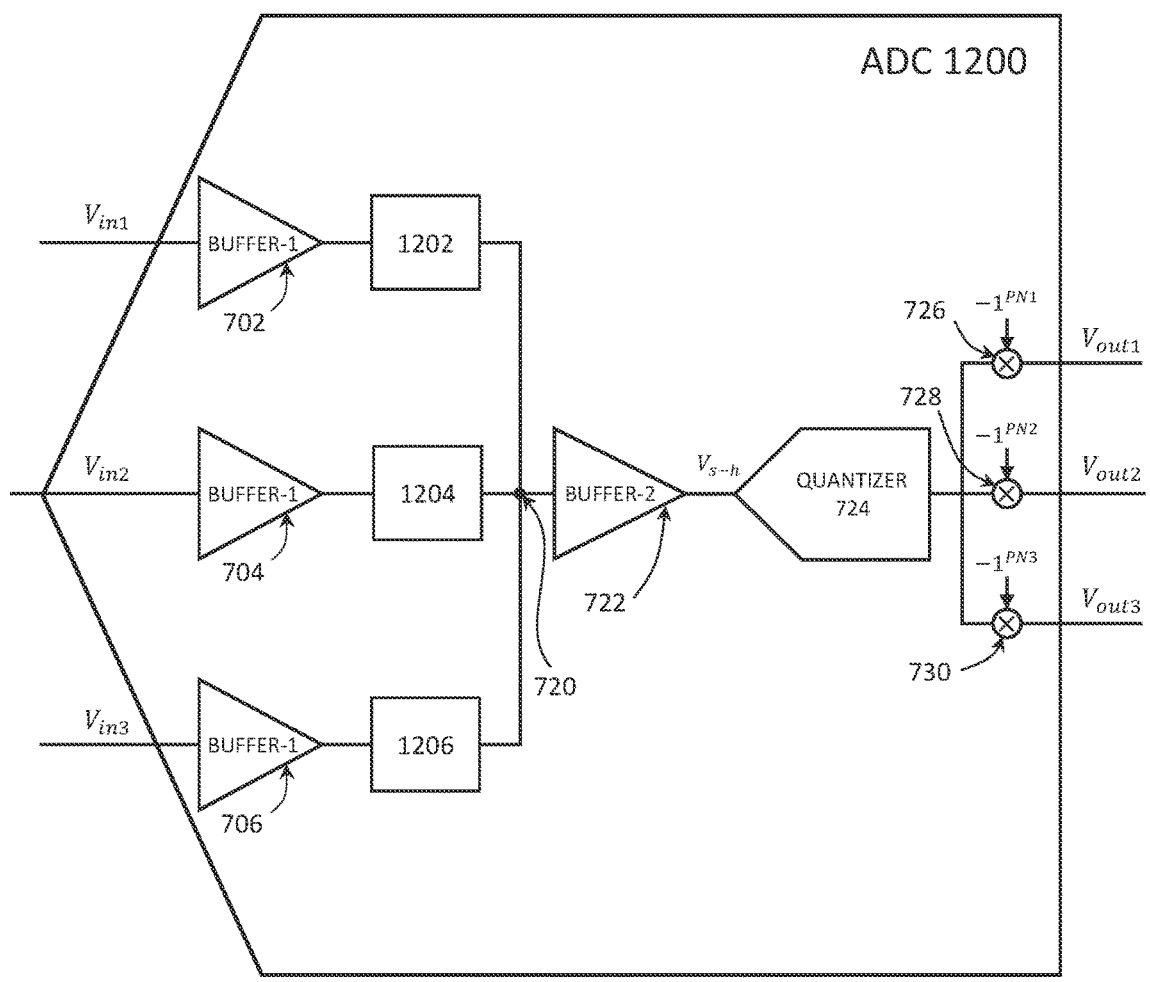
FIG. 12 shows another further exemplary multi-input ADC, according to some embodiments of the disclosure.

FIG. 12 shows another further exemplary multi-input ADC 1200, according to some embodiments of the disclosure. Each input (e.g., $V_{in1}$, $V_{in2}$, and $V_{in3}$) are sampled by parallel interleaved sampling networks, e.g., interleaved sampling network 1202, interleaved sampling network 1204, and interleaved sampling network 1206). The speed and performance of each interleaved sampling network can be improved through time-interleaving within the interleaved sampling network. A given interleaved sampling network, e.g., interleaved sampling network 1202, interleaved sampling network 1204, or interleaved sampling network 1206, can include multiple time-interleaved sampling networks.

Figure 13:
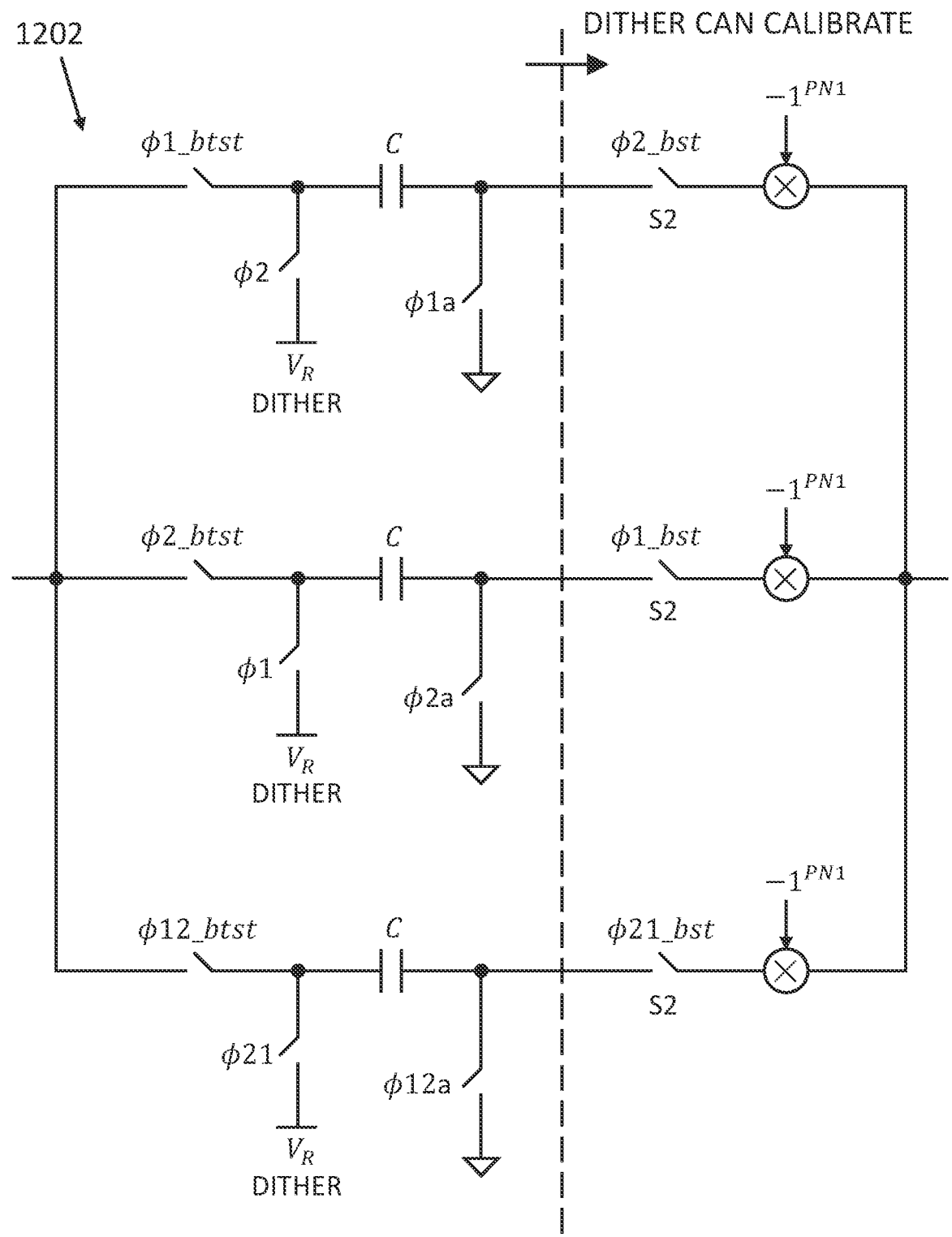
FIG. 13-15 show interleaved sampling networks of the multi-input ADC in FIG. 12, according to some embodiments of the disclosure.
Figure 14:
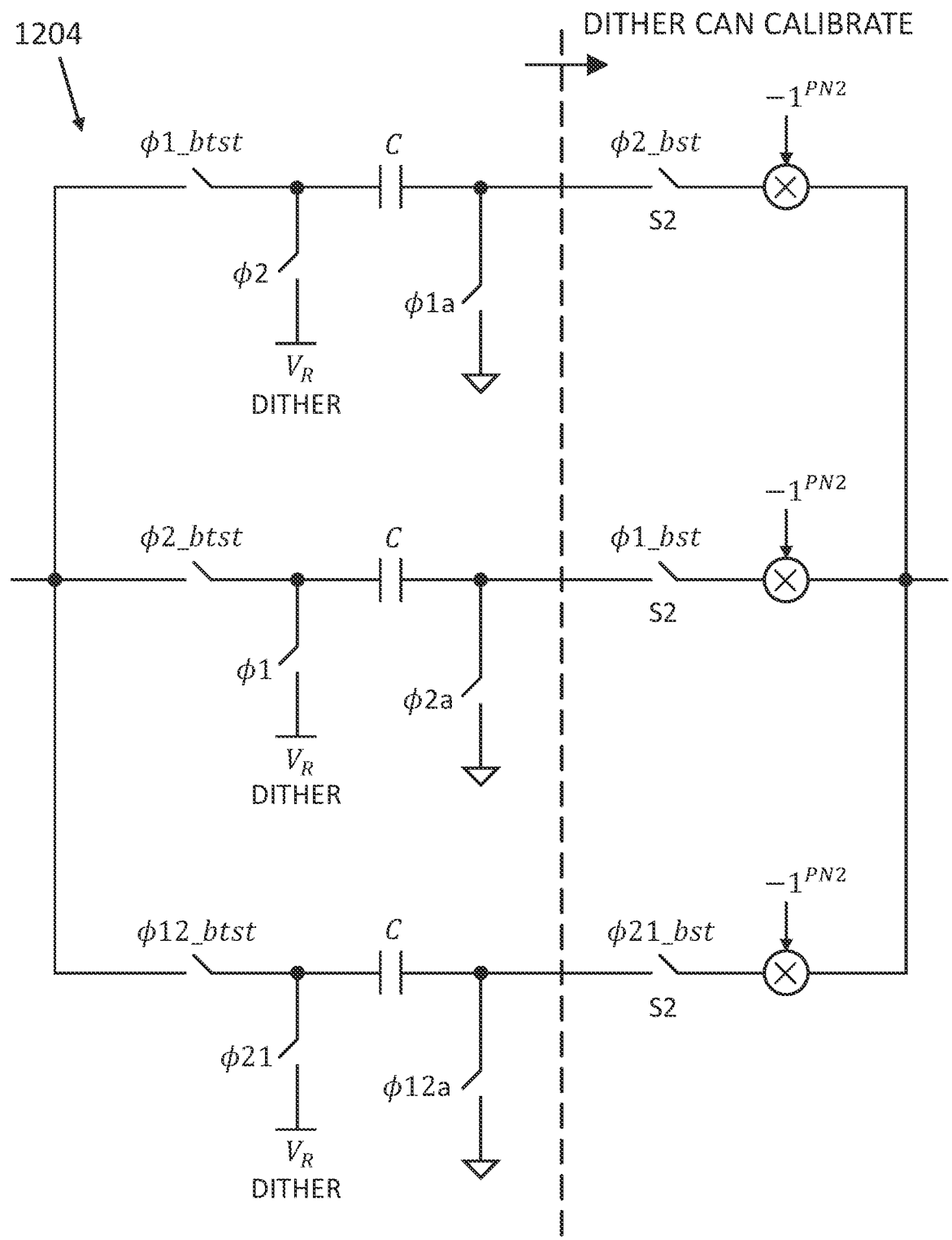
Figure 15:
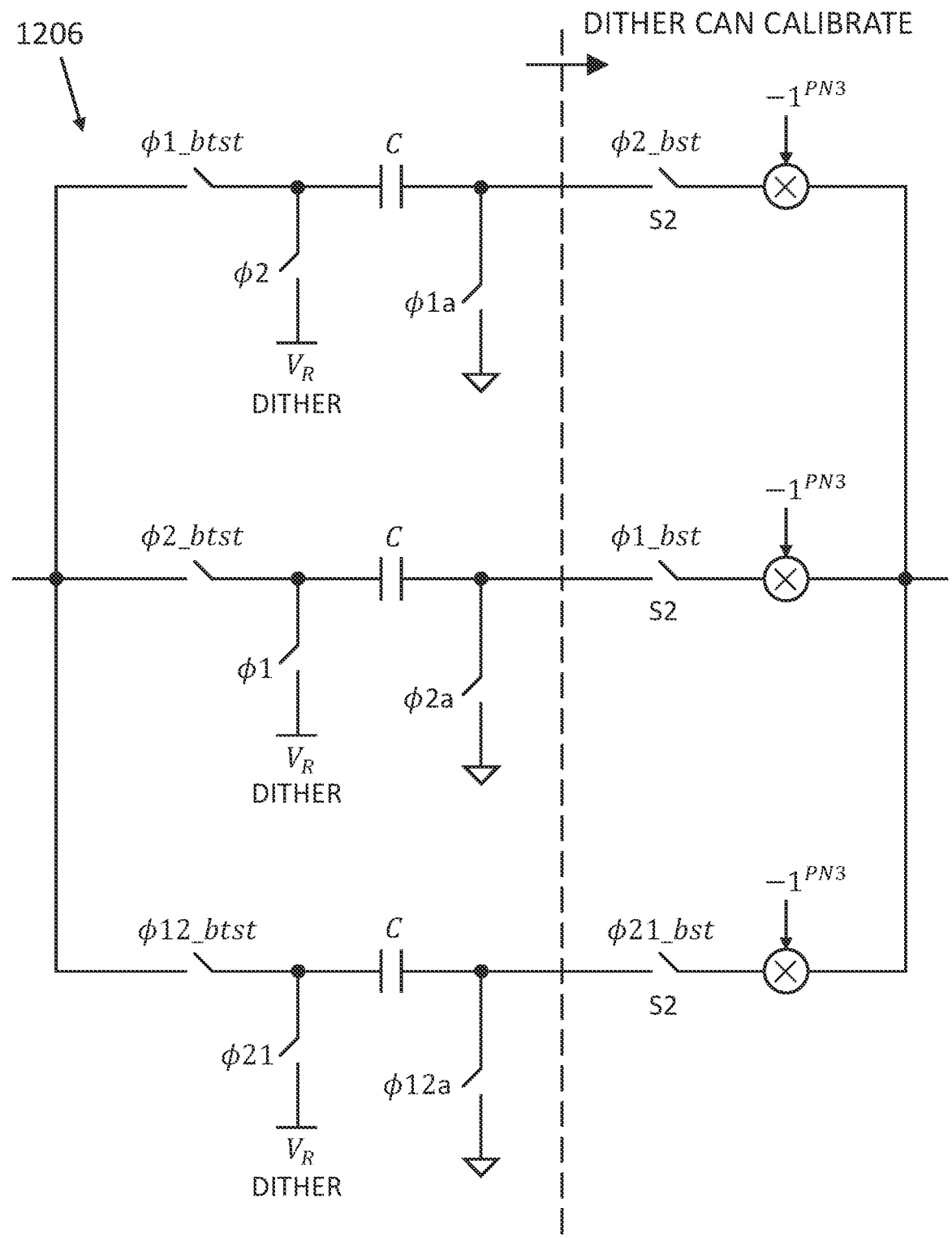

FIG. 13-15 show interleaved sampling networks 1202, 1204, and 1206 respectively of the multi-input ADC 1200 in FIG. 12, according to some embodiments of the disclosure. An interleaved sampling network comprises multiple time-interleaved sampling networks. For instance, FIG. 13 shows three time-interleaved sampling networks. FIG. 14 also three time-interleaved sampling networks. FIG. 15 also has three time-interleaved sampling networks. In this embodiment, multiple time-interleaved sampling networks of an interleaved sampling network can sample the input to the interleaved sampling network in a time-interleaved manner (e.g., one at a time, one after another) to increase the sampling rate (when compared to using just one sampling network). In some cases, with three sampling networks in a given interleaved sampling network, a 2-way (ping-ponged) time-interleaving scheme can be implemented, with a third sampling network used to enable randomization to spread residual interleaving errors in the noise floor.

In FIGS. 13-15, the chopping/coding can be performed in the hold phase, as shown. However, it is envisioned chopping/coding can be performed in the sample phase. Also, In FIGS. 13-15, the sampling is performed using inverted sampling networks with bottom plate sampling. It is envisioned that sampling performed using non-inverted sampling networks with bottom plate sampling is also possible. The code sequences, e.g., orthogonal codes being used to multiplex the inputs can be unique to each sampling network within an interleaved sampling network and/or to each input to the multi-input ADC 1200. In FIG. 13, the three multiple time-interleaved sampling networks in interleaved sampling network 1202 uses a first code orthogonal PN sequence PN1. In FIG. 14, the three multiple time-interleaved sampling networks in interleaved sampling network 1204 uses a second code orthogonal PN sequence PN2. In FIG. 15, the three multiple time-interleaved sampling networks in interleaved sampling network 1206 uses code orthogonal PN sequence PN3.

Spreading Factor

Typically, to achieve the desired spreading factor, the hold/spreading rate (referenced herein as fs2) should be higher than the input sampling rate (referenced herein as fs1). The ratio between the two rates represents the spreading factor F, which is typically equal to the number of inputs multiplexed in the sample phase. If the number of inputs multiplexed in the sample phase is N, then F equals to fs2/fs1, which is expected to equal to N.

To implementing a spreading factor, multiple capacitances are used in parallel in a given sampling network. The number of capacitances is typically equal to the number of inputs or the spreading factor. All the capacitors sample simultaneously at fs1, then they hold sequentially at the faster rate of fs2.

Figure 16:
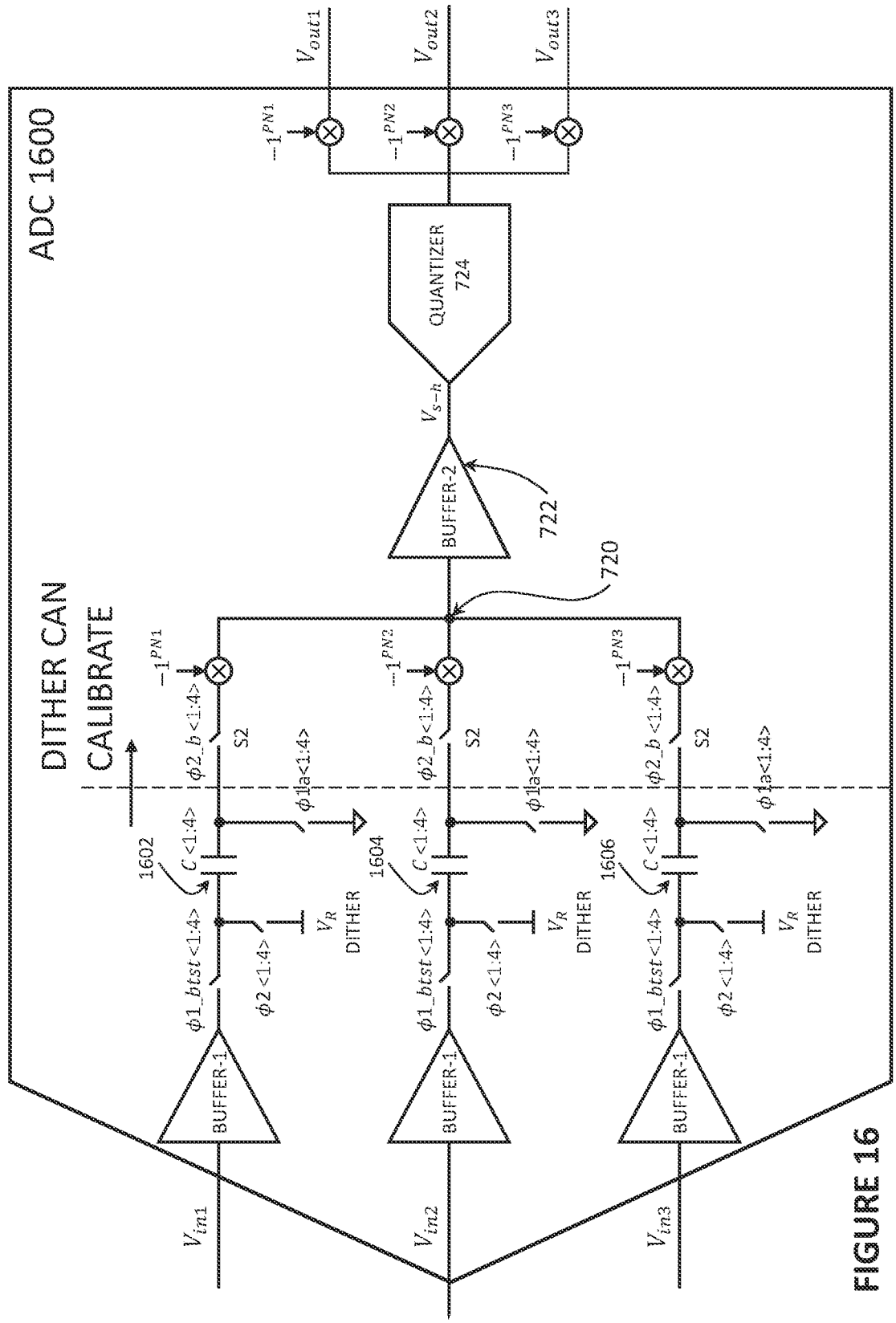
FIG. 16 shows yet another further exemplary multi-input ADC, according to some embodiments of the disclosure.

FIG. 16 shows yet another further exemplary multi-input ADC 1600, according to some embodiments of the disclosure. In the example shown in FIG. 16, the multi-input ADC 1600 has split T/H structures using chopping/coding in the hold phase and inverted sampling networks with bottom plate sampling. The sampling networks of the multi-input ADC 1600 is configured or adapted to support different sampling and holding rates (different fs1 and fs2). For instance, to support a spreading factor of 4, sampling capacitance for each input/channel includes 4 parallel capacitances, C <1:4>, that sample the input simultaneously at a sampling rate of fs1, and hold sequentially to support a holding rate of fs2=4fs1 (4 times the sampling rate fs1). Note that the 4 parallel input switches are provided for the 4 parallel capacitances, and the 4 parallel input switches are controlled by phases $\phi1\_bst$ <1:4>. If dither injection is implemented within the sampling network, there are also 4 corresponding dither injection switches, controlled by phases $\phi2$ <1:4>, to connect the top plate of a corresponding parallel capacitance to the node $V_R$. There are also 4 parallel output switches provided for the 4 parallel capacitances, and the 4 parallel output switches are controlled by phases $\phi2\_b$ <1:4>.

For instance, for the first input $V_{in1}$, the (aggregate) sampling capacitance 1602 in the sampling network has 4 parallel capacitances C <1:4>. There are also 4 input switches corresponding to the 4 parallel capacitances controlled by respective phases $\phi1\_bst$ <1:4>, 4 dither injection switches corresponding to the 4 parallel capacitances controlled by respective phases $\phi2$ <1:4>, 4 output switches corresponding to the 4 parallel capacitances controlled by respective phases $\phi2\_b$ <1:4>, and 4 bottom plate sampling switches corresponding to the 4 parallel capacitances controlled by respective phases $\phi1a$ <1:4>. The same applies to sampling capacitance 1604 and sampling capacitance 1606.

Figure 17:
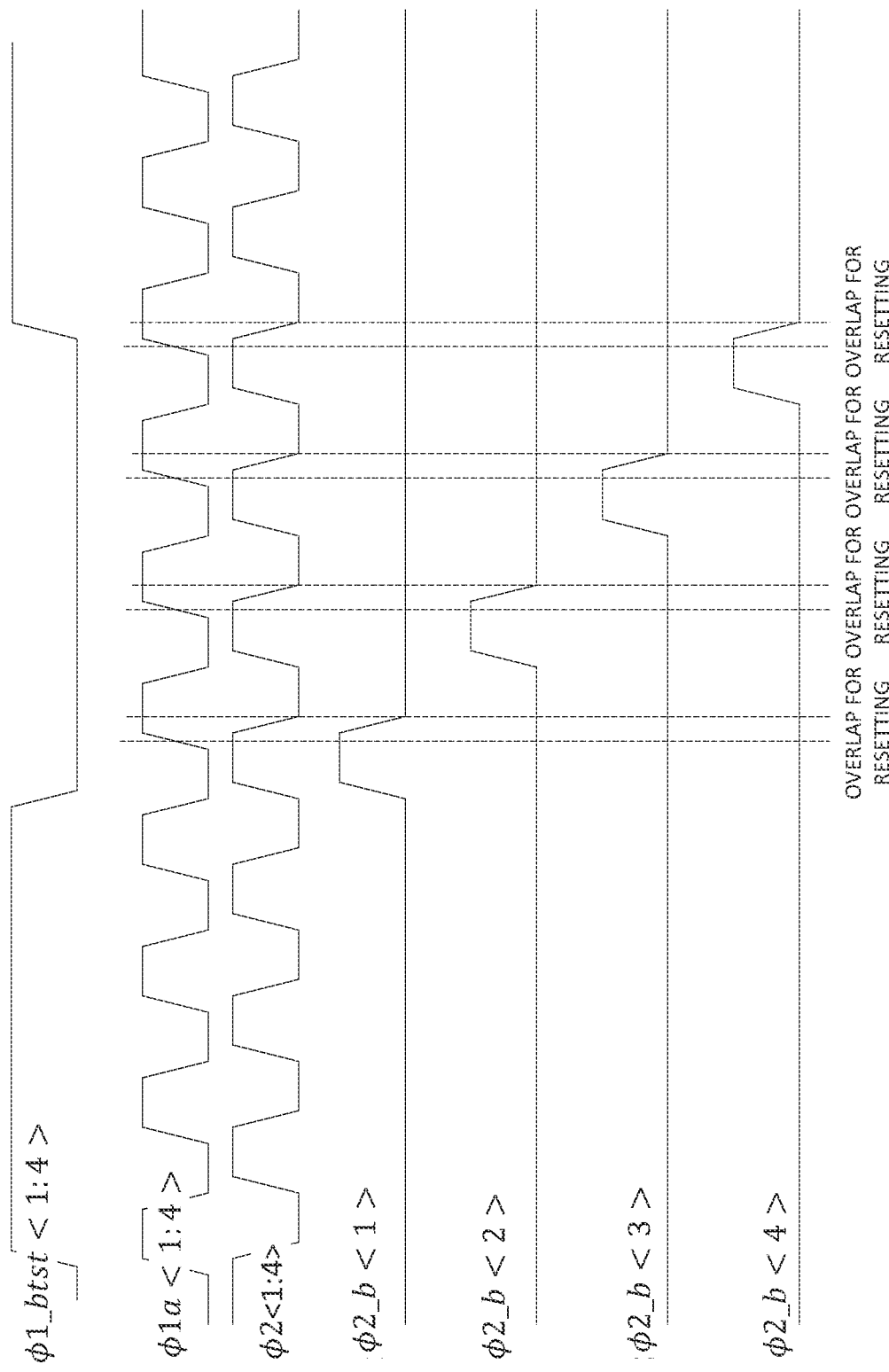
FIG. 17 is a timing diagram illustrating the timing of the switches in FIG. 16, according to some embodiments of the disclosure.

FIG. 17 is a timing diagram illustrating the timing of the switches labeled with different phases/timing in FIG. 16, according to some embodiments of the disclosure. It can be seen from the timing diagram that the multi-input ADC 1600 can perform sampling at fs1 and holding at fs2=4fs1. Referring back to the sampling capacitance 1602, the phases $\phi1\_bst$ <1:4> controlling the 4 input switches are the same and run at sampling rate fs1. The phases $\phi1a$ <1:4> controlling the 4 bottom plate sampling switches are also the same and run at holding rate fs2=4fs1. The phases $\phi2$ <1:4> controlling the 4 dither injection switches are also the same and run at holding rate fs2=4fs1. The phases/clocks $\phi2\_b$ <1>, $\phi2\_b$ <2>, $\phi2\_b$ <3>, $\phi2\_b$ <4> controlling respective output switches have respective pulses (at the holding rate fs2=4fs1) which are shifted in phase with respect to each other. The respective pulses of phases $\phi2\_b$ <1:4> can overlap with the pulses in the phases $\phi1a$ <1:4> controlling the 4 bottom plate sampling switches intentionally to reset the charge on the input of the hold buffer (e.g., Buffer-2 722). By carefully aligning the edges of the clocks φ2_b <1:4> and φ1a <1:4>, the memory effects can be reduced by overlapping the clocks/pulses of the phases φ2_b <1:4> and φ1a <1:4> and by partially (or completely) resetting the parasitic capacitances on the input of the hold buffer (Buffer-2 722).

Figure 18:
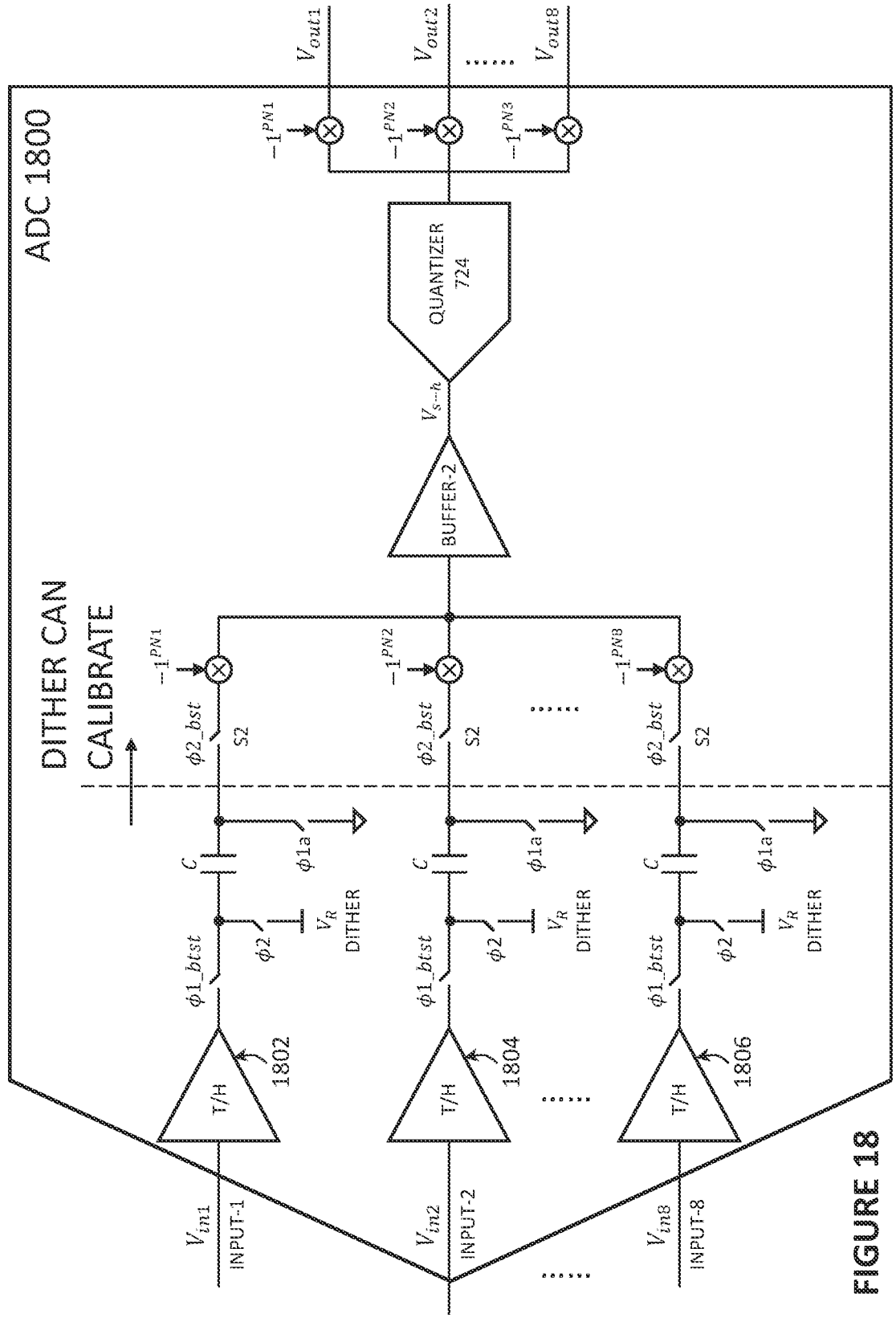
FIG. 18 shows another exemplary multi-input ADC, according to some embodiments of the disclosure.

FIG. 18 shows another exemplary multi-input ADC 1800, according to some embodiments of the disclosure. The multi-input ADC 1800 shows a different scheme that can implement a spreading factor F. The open-loop T/H circuits 1802, 1804, and 1806 support a sampling rate fs1 that is lower than the holding rate fs2. In the example shown, instead of using sampling buffers (Buffer-1's), the inputs are separately sampled and held by open-loop T/H circuits 1802, 1804, and 1806 at sampling rate fs1. The held outputs of the T/H circuits 1802, 1804, and 1806 are then up-sampled and coded at the rate of fs2 (the holding rate) by the sampling networks operating at fs2. Since the outputs of the T/H circuits 1802, 1804, and 1806 are held signals, the sampling circuits (switched-capacitor networks) following the T/H circuits can sample the held signals at a different/higher rate. In some cases, parallel capacitances can be used to perform up-sampling and coding at fs2 in FIG. 18, but it is not necessary to have parallel capacitances since the T/H circuits 1802, 1804, and 1806 provide held signals.

Amplitude or Peak Detection and Automatic Gain Control

Amplitude (peak or signal level) detection can be employed for each input signal (e.g., $V_{in1}$, $V_{in2}$, $V_{in3}$) in order to measure the RSSI (Relative Received Signal Strength). To perform amplitude or peak detection, peak detectors can be provided for one or more of the input signals to separately to detect over-ranging condition(s) of a given input signal, or the crossing of a certain threshold (e.g., signal level) by the given input signal. Analog peak detectors, comparators (e.g., a flash ADC), and/or suitable combination of the above, can be used to detect these conditions. Depending on the implementation, peak detectors can operate directly on the input (directly at the input to the multi-input ADC), on the sampled input (e.g., any suitable node in the sampling path), and/or on the held input (e.g., at the output of the sampling/switched-capacitor circuits).

A peak detector can operate on each channel/input, or on the summed voltage (at the node where the multiple coded input signals are multiplexed and combined). Peak detectors can generate flags (or bits) to indicate signal level. The flags can be used for Automatic Gain Control (AGC) in order to enable fast control loops that prevent over-ranging the ADC and improve its noise performance. AGC can be done by giving the bits to an amplifier that is driving the ADC or by feeding it to an internal variable gain amplifier.

Figure 19:
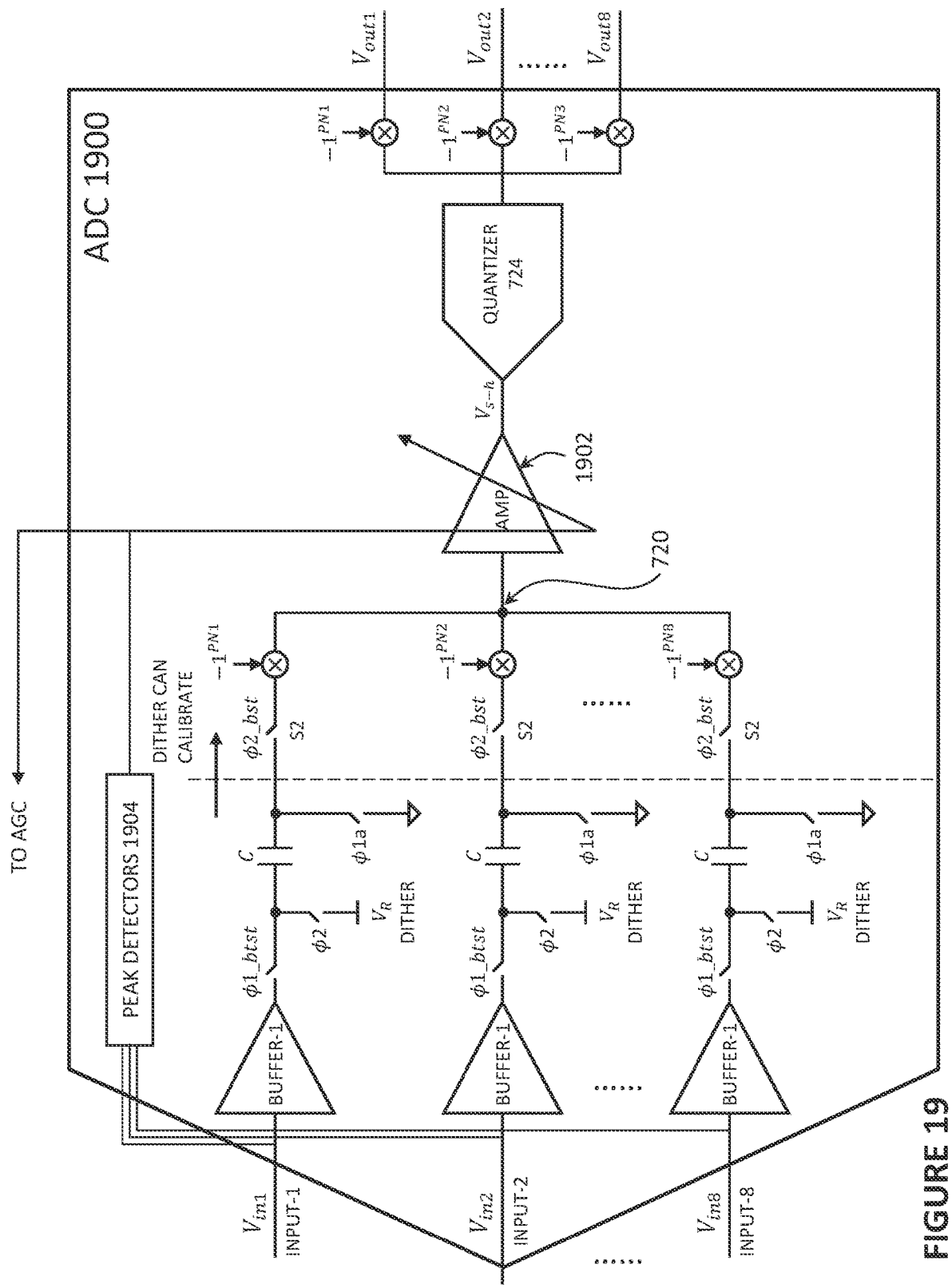
FIG. 19 shows yet another exemplary multi-input ADC, according to some embodiments of the disclosure.

FIG. 19 shows yet another exemplary multi-input ADC 1900, according to some embodiments of the disclosure. In this example, peak detectors 1904 are coupled to the inputs to the parallel channels to measure the signal levels (separately for each input). The output of the peak detectors (flags/bits) can be extracted out of the ADC 1900 for AGC control, e.g., fed to an amplifier external to the multi-input ADC 1900 (an amplifier or circuit that is driving the multi-input ADC 1900). The output of the peak detectors 1904 can also (in the alternative or additionally) be used to control the gain of the variable gain amplifier 1902 (serving as stage between the sampling/switched-capacitor networks and quantizer 724 and replacing a hold buffer "Buffer-2") inside the multi-input ADC 1900. In this example, the second buffer of the T/H is replaced with an amplifier.

These peak detectors can be included in various multi-input ADCs described and envisioned herein.

Exemplary Method

Figure 20:
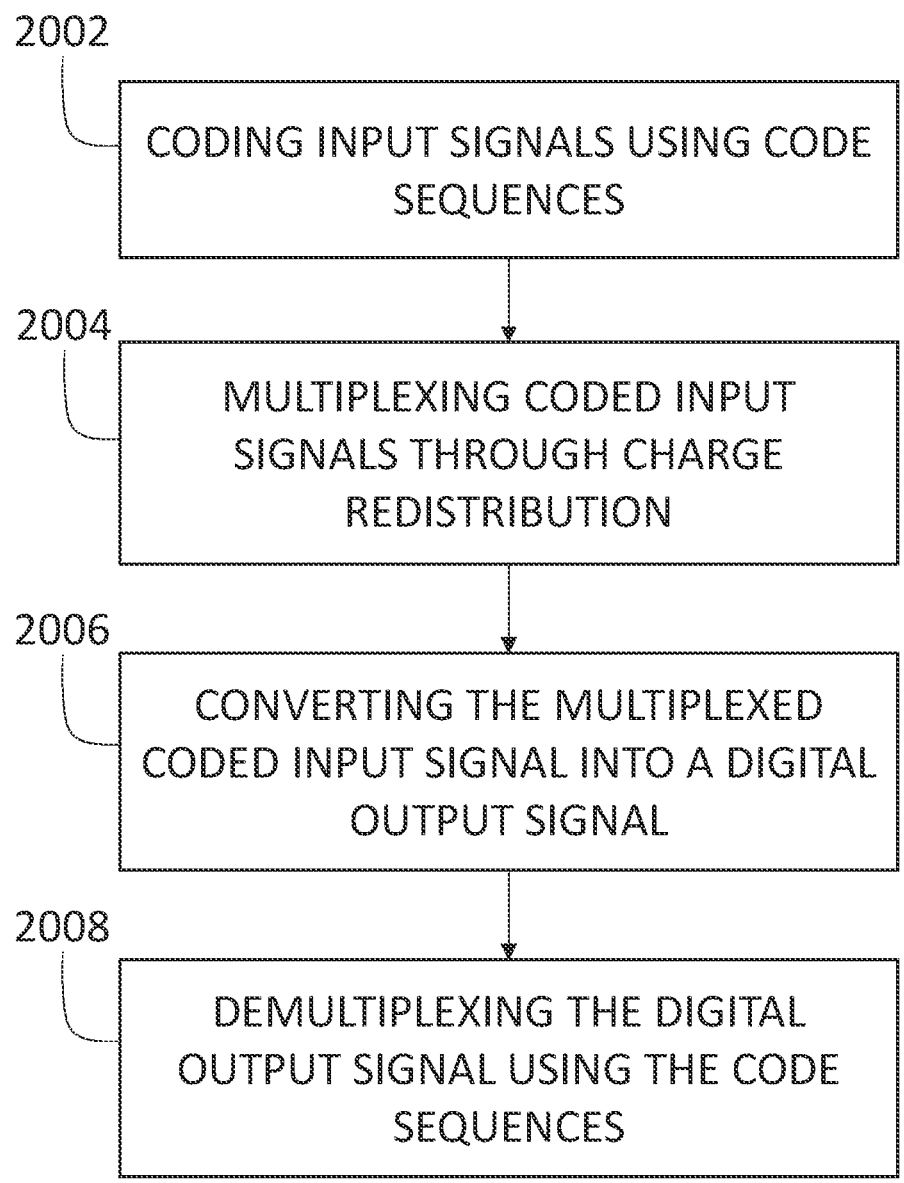
FIG. 20 shows a flow diagram illustrating a method for multiplexing inputs in an analog-to-digital converter, according to some embodiments of the disclosure.

FIG. 20 shows a flow diagram illustrating a method for multiplexing inputs in an analog-to-digital converter, according to some embodiments of the disclosure. In 2002, respective input signals in respective parallel signal paths are coded using respective code sequences. In 2004, coded input signals are multiplexed through charge redistribution of parallel sampling capacitors in the parallel signal paths. In 2006, a quantizer can convert the multiplexed coded input signal into a digital output signal. In 2008, the digital output signal can be demultiplexed into separate digital output signals using the respective code sequences (or equivalently, code sequences which correspond to the respective code sequences).

Examples of T/H Circuits

Example 1 is track and hold circuit comprising a sampling buffer, a sampling network receiving a buffered input from the sampling buffer, and a hold buffer receiving a held signal from the sampling network.

In Example 2, the track and hold circuit of Example 1 can further the sampling network comprising a node for receiving an additive dither.

In Example 3, the track and hold circuit of Example 1 or 2 can further include a chopper integrated with the sampling network.

In Example 4, the track and hold circuit of any one of Examples 1-3 can further include one or more further sampling networks in parallel.

In Example 5, the track and hold circuit of Example 4 can further include the sampling networks sampling the buffered input from the sampling buffer in a time-interleaved manner.

In Example 6, the track and hold circuit of Example 4 or 5 can further include the sampling networks sampling the buffered input from the sampling buffer in a randomized time-interleaved manner.

In Example 7, the track and hold circuit of any one of Examples 4-6 can further include the sampling networks being configurable to sample the buffered input in different modes.

In Example 8, the track and hold circuit of any one of Examples 1-7 can further include one or more further hold buffers.

In Example 9, the track and hold circuit of any one of Examples 4-7 can further include one or more further hold buffers each dedicated to each sampling network.

Example 101 is a method comprising: buffering an input signal; during a sample phase, sampling the buffered input signal onto a capacitor; and during a hold phase, connecting a node having a dither signal to the capacitor to output a held signal having the dither signal; buffering the held signal.

In Example 102, the method of Example 101 can further include randomly chopping the held signal prior to buffering the held signal.

In Example 103, the method of Example 101 or 102 can further include driving a plurality of ADCs which are operating in a time-interleaved manner.

As seen in FIGS. 4-7, 9-11, 13-16, 18, and 19, the additive dither is injected using the capacitor that is also sampling the input signal (e.g., C 402 in FIG. 4, C 502 in FIG. 5, and C 602 in FIG. 6). Note that by using the same capacitor that is also sampling the input signal to inject the dither, the dither may remain on the capacitor and cause kick-back errors.

This implementation can be referred to as a shared-capacitor dither injection. Alternatively, a dither capacitor, separate from the capacitor sampling the input signal, can be used to inject the additive dither in the switched-capacitor network of the T/H circuit. This implementation can be referred to as a split-capacitor dither injection. The dither capacitor can be connected to a summing node of the switched-capacitor network. Using a separate capacitor allows the dither to be isolated from the capacitor that is sampling the input signal and avoids kick-back errors.

There are several considerations to take into account when using the same capacitor to sample the input signal and to inject an additive dither. Settling in the hold phase is faster. There is better/lower loss due to fewer capacitors connected to a summing node of the switched-capacitor network (i.e., the input of Buffer-2 206). There are fewer switches and clock signals needed to control the switches, which means less power consumption and less complexity. As mentioned before, the dither is not removed from the capacitor that is also performing sampling when switching from the hold phase to the sample phase. The dither can kick the input and kick-back calibration may be needed to remove the error caused by the kick-back to achieve a certain level of performance (and reduce distortions).

There are also several considerations to take into account when using a dither capacitor separate from the capacitor performing the sampling. Settling in the hold phase is slower, since time is need to charge the dither capacitor during the hold phase to inject the dither. There is worse/more loss due to more capacitors connected to the summing node of the switched-capacitor network (i.e., the input of Buffer-2 206). Having a separate dither capacitor also means there are more switches and clock signals needed to control the switches, which means more power consumption and more complexity. As mentioned before, the separate dither capacitor can isolate the dither from the capacitor performing the sampling of the input signal, which means that kick-back can be prevented. Moreover, the isolation of the dither capacitor allows for resetting/removal of the dither, which means there is less interaction between the dither and the input.

Figure 21:
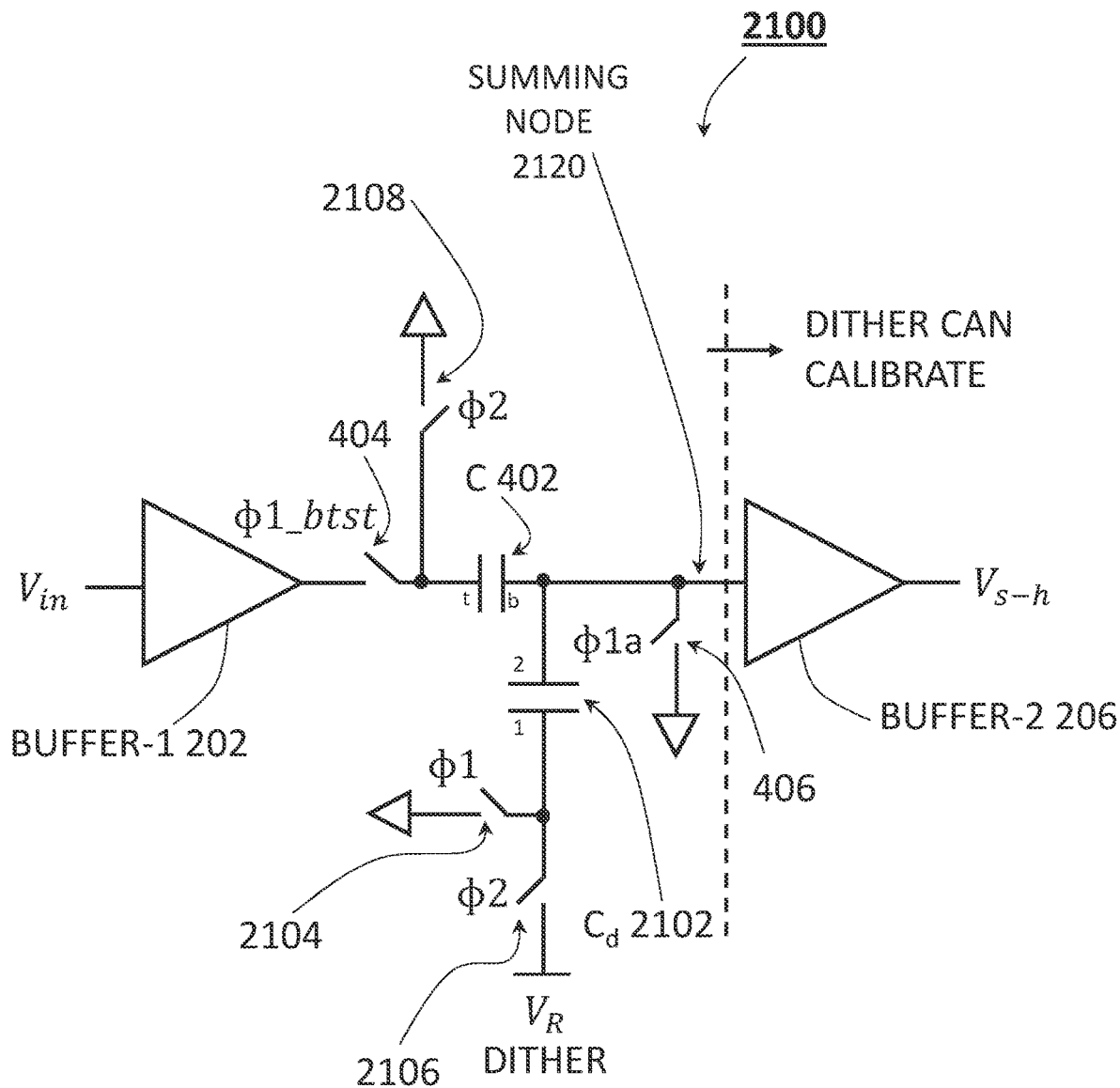
FIG. 21 shows an exemplary track and hold circuit illustrating an exemplary switched-capacitor network with sampling and dither injection, according to some embodiments of the disclosure.

FIG. 21 shows an exemplary T/H circuit 2100 illustrating one exemplary switched-capacitor network with sampling and dither injection, according to some embodiments of the disclosure. Similar to FIG. 4, the switched-capacitor network has capacitor C 402 for sampling the input, an input switch 404 for receiving the (buffered) input from Buffer-1 202, a sampling switch 406. Different from FIG. 4 is that a dither injection switched-capacitor network is added to the switched-capacitor network. The dither injection switched-capacitor network is added to a summing node 2120 of the switched-capacitor network, which is at the input of Buffer-2 206. The dither injection switched-capacitor network includes dither capacitor Ca 2102, a reset switch 2104 to connect a first plate (labeled as "1") of the dither capacitor Ca 2102 to ground, and a dither injection switch 2106 to connect the first plate of the dither capacitor Ca 2102 to node $V_R$. Furthermore, a transfer switch 2108 is added to connect the top plate of the capacitor C 402 to ground.

In the switched-capacitor network, a dither voltage level provided at node $V_R$ is injected using a dither capacitor Ca 2102 in the switched-capacitor network at the input of Buffer-2 206, which is also the bottom plate of capacitor C 402. A dither voltage level can be provided at node $V_R$. The dither can be used to calibrate Buffer-2 206 and the ADC following the T/H circuit 2100. A second plate (labeled as "2") of the dither capacitor $C_d$ 2102 is connected to the bottom plate of capacitor C 402, which is also the summing node 2120. The first plate (labeled as "1") of the dither capacitor $C_d$ 2102 is connected to ground during ϕ1 (sample phase). The first plate of the dither capacitor $C_d$ 2102 is connected to node $V_R$ during ϕ2 (hold phase).

During sample phase, the input switch 404 having phase ϕ1_btst and the sampling switch 406 having phase ϕ1a are closed. The input switch 404 connects the top plate of the capacitor C 402 to sample the input signal (e.g., sample the output of Buffer-1 202) onto the capacitor C 402. The sampling switch 406 connects the bottom plate of the capacitor C 402 to ground. The input switch 404 can be a bootstrapped switch (i.e., bootstrapped to the buffered input) to achieve good linearity. The sampling switch 406 having phase ϕ1a is advanced (opens before the input switch 404 is opened at the end of the sample phase) to achieve bottom plate sampling. The reset switch 2104 having phase ϕ1 is closed, and so is the sampling switch 406 having phase ϕ1a at the beginning of the sample phase. When the reset switch 2104 and the sampling switch 406 are closed, the first plate of the dither capacitor $C_d$ 2102 is connected to ground, and the second plate of the dither capacitor $C_d$ 2102 is connected to ground, respectively.

Closing the reset switch 2104 and the sampling switch 406 thus clears/resets the dither capacitor $C_d$ 2102. The dither injection switch 2106 having phase ϕ2 is opened and the transfer switch 2108 having phase ϕ2 are open during the sample phase. At the end of the sample phase, the input signal is sampled onto capacitor C 402, and the dither capacitor $C_d$ 2102 is cleared/reset.

During a hold phase, the input switch 404 having phase ϕ1_btst, the sampling switch 406 having phase ϕ1a, and the reset switch 2104 having phase ϕ1 are opened. Dither injection switch 2106 having phase ϕ2 closes to connect the first plate of the dither capacitor $C_d$2102 to the node $V_R$. Transfer switch 2108 having phase ϕ2 closes to connect the top plate of capacitor C 402 to ground to transfer the sampled input to the summing node 2120. Additive dither can be injected in the switched-capacitor network and is added at the summing node 2120. Accordingly, the input signal and the additive dither appear at the summing node 2120 of the switched-capacitor circuit (i.e., the input of Buffer-2 206).

The T/H circuit 2100, e.g., the switched-capacitor network and Buffer-2 206, holds the sampled voltage (the sampled input signal), plus the additive dither injected, at the output as $V_{s-h}$. In this embodiment, the output bias point of Buffer-1 202 does not need to be compatible with the input bias point of Buffer-2 206. The output $V_{s-h}$ in FIG. 21 is an inverted version of the input Vin plus the additive dither injected at node $V_R$.

Figure 22:
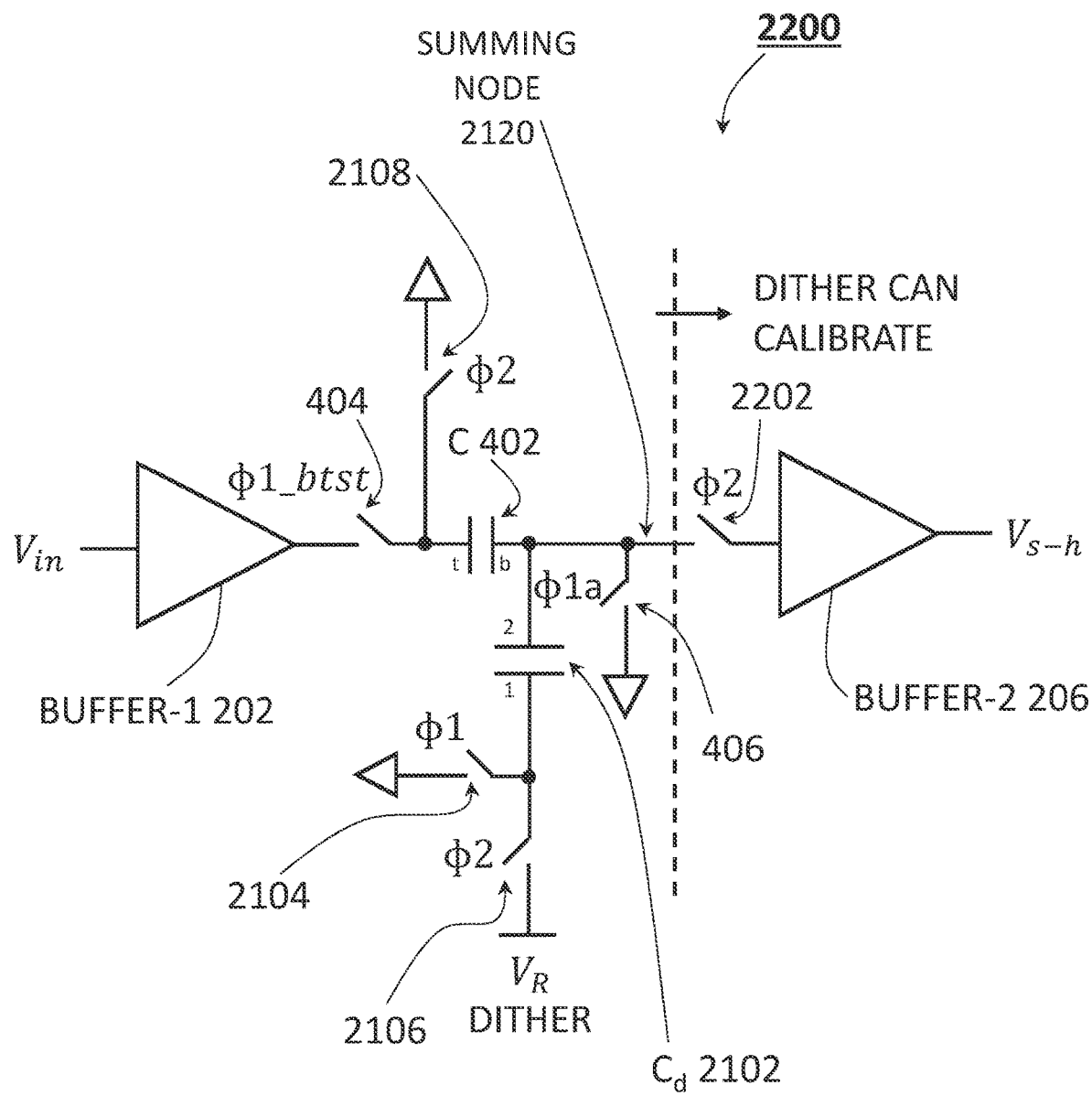
FIG. 22 shows an exemplary track and hold circuit illustrating an exemplary switched-capacitor network with sampling and dither injection, according to some embodiments of the disclosure.

FIG. 22 shows an exemplary T/H circuit 2200 illustrating yet another exemplary switched-capacitor network with sampling and dither injection, according to some embodiments of the disclosure. FIG. 22 is similar to FIG. 21, where FIG. 22 adds an output switch 2202. The sample phase and hold phase operations are the same as FIG. 21, but an additional switch (i.e., the output switch 2202) is provided at the summing node 2120. The output switch 2202 having phase ϕ2 disconnects the summing node 2120, i.e., the bottom plate of capacitor C 402 and the second plate of dither capacitor Ca 2102, from the input of Buffer-2 206 during the sample phase. When the output switch 2202 is open, the output switch 2202 can isolate the switched-capacitor network from the Buffer-2 206 (and vice versa). The output switch 2202 having phase ϕ2 connects the summing node 2120, i.e., the bottom plate of capacitor C 402 and the second plate of dither capacitor Ca 2102, to the input of Buffer-2 206 during the hold phase.

The output switch 2202 thus transfers the input signal and the additive dither appearing at the summing node 2120 to the Buffer-2 206. The output switch 2202 does not have to be bootstrapped for linearity, if the additive dither is used to calibrate out the non-linearity of the output switch 2202.

Figure 23:
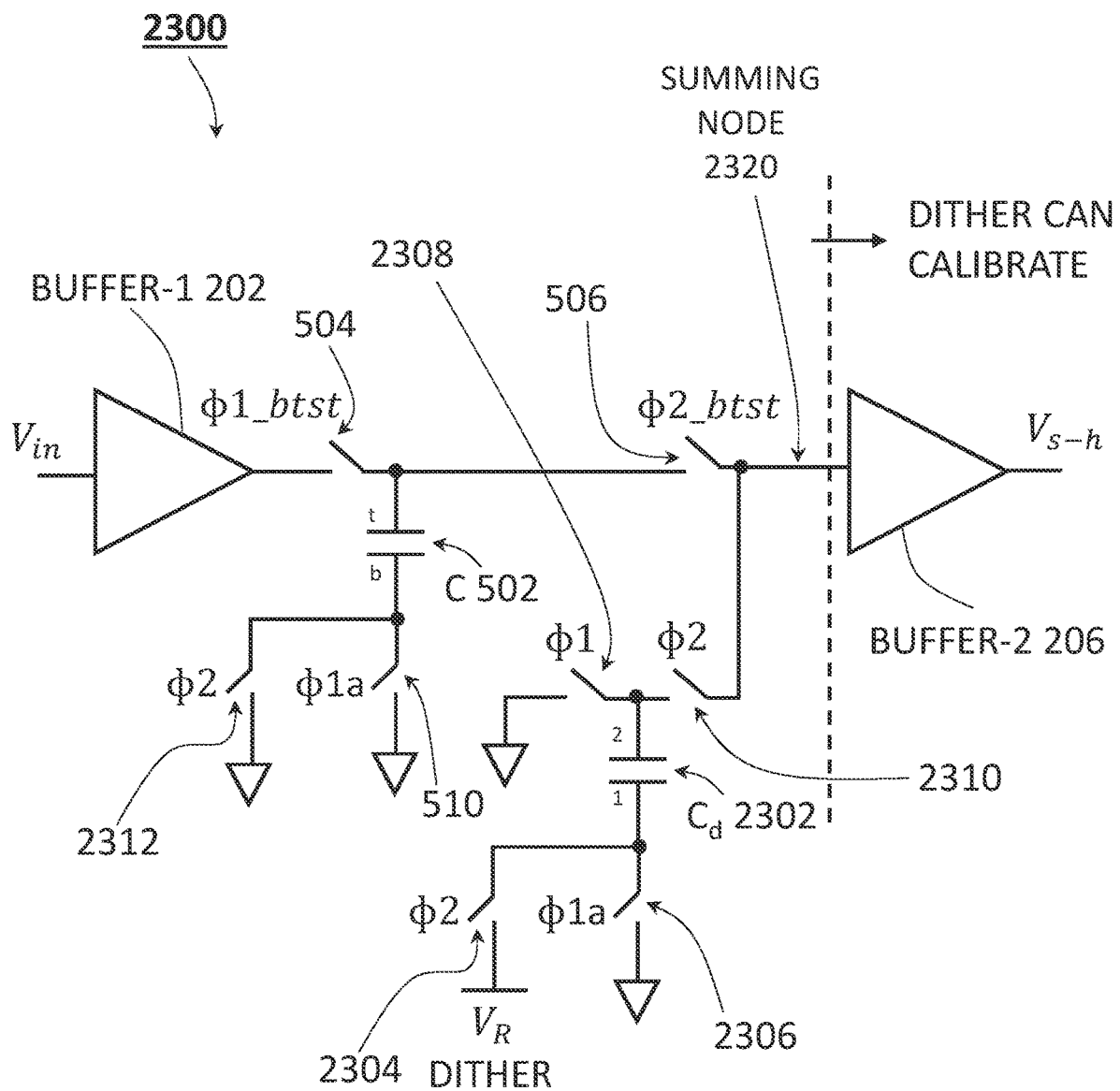
FIG. 23 shows an exemplary track and hold circuit illustrating an exemplary switched-capacitor network with sampling and dither injection, according to some embodiments of the disclosure.

FIG. 23 shows an exemplary T/H circuit 2300 illustrating another exemplary switched-capacitor network with sampling and dither injection, according to some embodiments of the disclosure. Similar to FIGS. 21 and 22, additive dither is injected in the switched-capacitor network and can be used to calibrate circuitry downstream from the node where dither is injected, such as Buffer-2 206 and the ADC following the T/H circuit 2300. Similar to FIG. 5, the switched-capacitor network has capacitor C 502 for sampling the input, an input switch 504 for receiving the (buffered) input from Buffer-1 202, a sampling switch 510, and an output switch 506. Different from FIG. 5 is that a dither injection switched-capacitor network is added to the switched-capacitor network. The dither injection switched-capacitor network is added to a summing node 2320 of the switched-capacitor network, which is at the input of Buffer-2 206, and downstream from the output switch 506. The dither injection switched-capacitor network includes dither capacitor $C_d$ 2302, a first reset switch 2306 to connect a first plate (labeled as "1") of the dither capacitor $C_d$ 2302 to ground, a dither injection switch 2304 to connect the first plate of the dither capacitor $C_d$ 2302 to node $V_R$, a second reset switch 2308 to connect the second plate (labeled as "2") of the dither capacitor $C_d$ 2302 to ground, and a dither transfer switch 2310 to connect the second plate of the dither capacitor $C_d$ 2302 to the summing node 2320.

Furthermore, a transfer switch 2312 is added to connect the bottom plate of the capacitor C 502 to ground.

In the switched-capacitor network, a dither voltage level provided at node $V_R$ is injected using a dither capacitor $C_d$ 2302 in the switched-capacitor network at the input of Buffer-2 206. A dither voltage level can be provided at node $V_R$. The dither can be used to calibrate Buffer-2 206 and the ADC following the T/H circuit 2300. A second plate (labeled as "2") of the dither capacitor $C_d$ 2302 is connected to ground during φ1 (sample phase). The second plate of the dither capacitor is connected to the summing node 2320 during phase φ2 (hold phase). The first plate (labeled as "1") of the dither capacitor $C_d$ 2302 is connected to ground during φ1 (sample phase). The first plate of the dither capacitor $C_d$ 2302 is connected to node $V_R$ during φ2 (hold phase).

Duringسample phase, the input switch 504 having phase φ1_btst and the sampling switch 510 having phase φ1a are closed. The input switch 504 connects the top plate of the capacitor C 502 to sample the input signal (e.g., sample the output of Buffer-1 202) onto the capacitor C 502. The sampling switch 510 connects the bottom plate of the capacitor C 502 to ground. The input switch 504 can be a bootstrapped switch (i.e., bootstrapped to the buffered input) to achieve good linearity. The sampling switch 510 having phase φ1a is advanced (opens before the input switch 504 is opened at the end of the sample phase) to achieve bottom plate sampling. The second reset switch 2308 having phase φ1 is closed, and so is the first reset switch 2306 having phase φ1a at the beginning of the sample phase. The first reset switch 2306 having phase φ1a is advanced (opens before second reset switch 2308 is opened at the end of the sample phase) to achieve bottom plate sampling. When the first reset switch 2306 and the second reset switch 2308 are closed, the first plate of the dither capacitor $C_d$ 2302 is connected to ground, and the second plate of the dither capacitor $C_d$ 2302 is connected to ground, respectively. Closing the first reset switch 2306 and second reset switch 2308 thus clears/resets the dither capacitor $C_d$ 2302. The dither injection switch 2304 having phase φ2, the dither transfer switch 2310 having phase φ2, the output switch 506 having phase φ2_btst, and the transfer switch 2312 having phase φ2 are open during the sample phase. At the end of the sample phase, the input signal is sampled onto capacitor C 502, and the dither capacitor $C_d$ 2302 is cleared/reset.

During a hold phase, the input switch 504 having phase φ1_btst, the sampling switch 510 having phase φ1a, the first reset switch 2306 having phase φ1a, and the second reset switch 2308 having phase φ1 are opened. Dither injection switch 2304 having phase φ2 closes to connect the first plate of the dither capacitor $C_d$ 2302 to the node $V_R$. Dither transfer switch 2310 having phase φ2 closes to connect the second plate of the dither capacitor $C_d$ 2306 to the summing node 2320 to transfer the dither (or adds the dither) to the summing node 2320. Output switch 506 also closes to connect the top plate of capacitor 502 to the summing node 2320.

Transfer switch 2312 having phase φ2 closes to connect the bottom plate of capacitor C 502 to ground to transfer the sampled input to the summing node 2320. Accordingly, the input signal and the additive dither appear at the summing node 2320 of the switched-capacitor circuit (i.e., the input of Buffer-2 206).

The T/H circuit 2300, e.g., the switched-capacitor network and Buffer-2 206, holds the sampled voltage (the sampled input signal), plus the additive dither injected, at the output as $V_{s-h}$. In this embodiment, the output bias point of Buffer-1 202 is preferably compatible with the input bias point of Buffer-2 206. The output $V_{s-h}$ is a non-inverted version of the input Vin plus the additive dither injected at node $V_R$.

The output switch 506 can optionally be a bootstrapped switch to achieve good linearity. Compared to the T/H circuit 2100 in FIG. 21, the T/H circuit 2300 can have two bootstrapped switches (instead of just one), which can be more complicated and expensive.

However, having the two bootstrapped switches can provide better isolation, and can enable more than one sampling network to be used (e.g., more than one switched-cap network sampling in an interleaved fashion) with the same Buffer-2 206, if needed, to achieve higher speeds.

Figure 24:
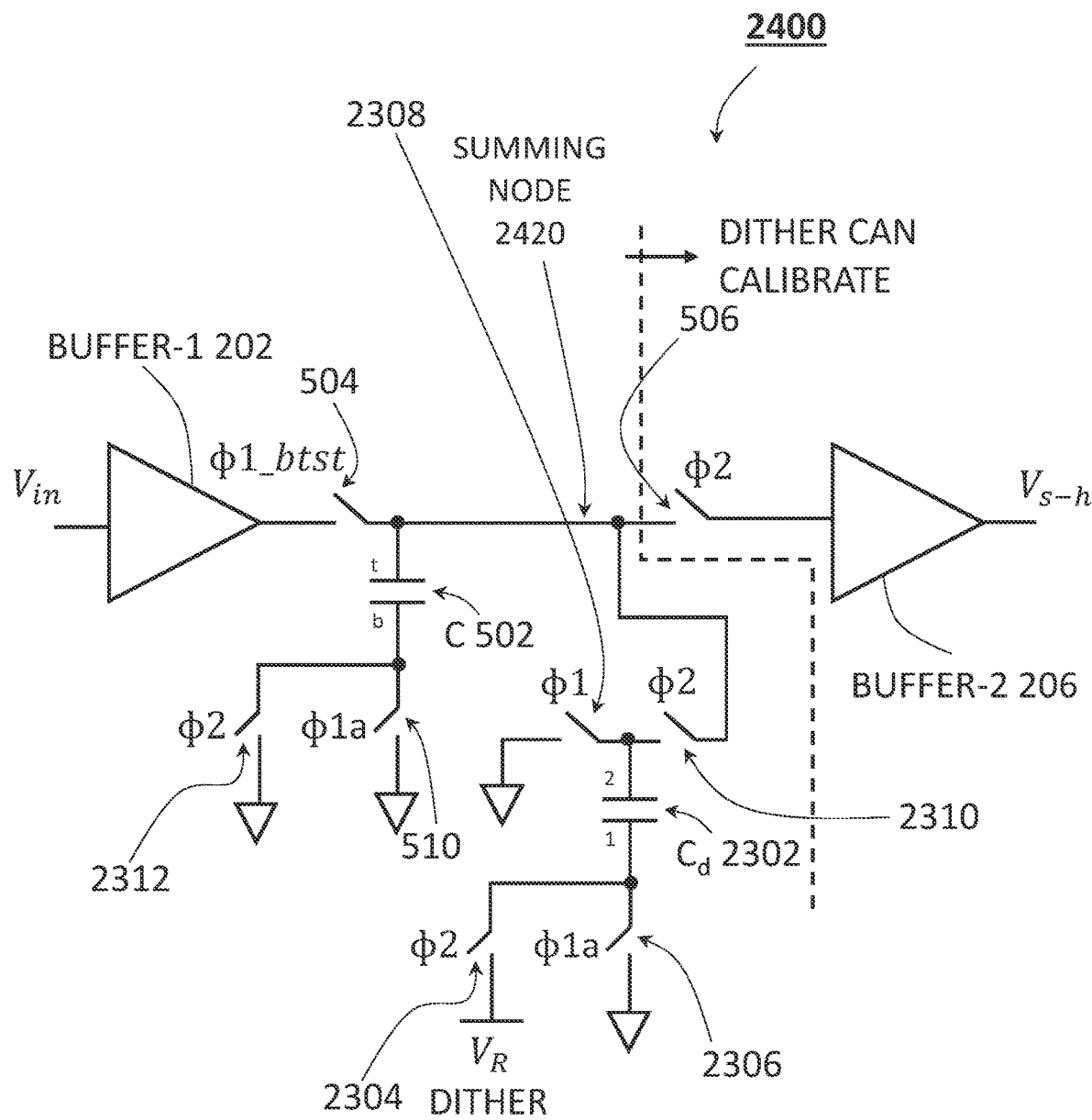
FIG. 24 shows an exemplary track and hold circuit illustrating an exemplary switched-capacitor network with sampling and dither injection, according to some embodiments of the disclosure.

FIG. 24 shows an exemplary T/H circuit 2400 illustrating another exemplary switched-capacitor network with sampling and dither injection, according to some embodiments of the disclosure. Similar to FIG. 23, additive dither is injected in the switched-capacitor network and can be used to calibrate circuitry downstream from the node where dither is injected, such as Buffer-2 206 and the ADC following the T/H circuit 2400. Different from FIG. 23 is that in FIG. 23 a dither injection switched-capacitor network is added to a summing node 2420 (which is also the top plate of capacitor C 502) that is upstream from output switch 506.

The dither transfer switch 2310 having phase φ2 connects the second plate of the dither capacitor Ca 2302 to the summing node 2420 during hold phase to add the dither to the summing node 2420. The output switch 506 having phase φ2 connects the top plate of the capacitor C 502 (which is also the summing node 2420) to the input of Buffer-2 206.

By adding the dither upstream of the output switch 506, the dither can be used to calibrate output switch 506, and the need to have the output switch 506 to be bootstrapped can be avoided. Output switch 506 does not have to be bootstrapped, since the dither being injected can be used to calibrate output switch 506. If indeed the output switch 506 is bootstrapped, then calibration may not be needed since the output switch 506 is linear enough. If the output switch 506 is not bootstrapped (e.g., just boosted), as seen in FIG. 24, then calibration can be used to address non-linearities of the output switch 506.

In some embodiments, bottom plate sampling is optional. When bottom plate sampling is implemented, the sampling of the input signal onto a capacitor and even clearing/resetting of the dither capacitor can benefit from reduced distortions.

In some embodiments, the output switch 2202 and the output switch 506 seen in the FIGURES can be integrated with a chopper to inject a multiplicative dither (e.g., as illustrated in FIG. 8). In some embodiments, the output switch 2202 and the output switch 506 seen in the of FIGS. 22-24 can be integrated with a chopper to implement coding during the hold phase, as described in relation to the multi-input T/H circuits. In some embodiments, the input switch 404 and the input switch 504 of FIGS. 21-24 can also be integrated with a chopper to implement coding during the sample phase, as described in relation to the multi-input input circuits.

Example 201 is a low-power track and hold circuit, the low-power track and hold circuit comprising: a sampling buffer; a sampling network to sample a buffered input signal from the sampling buffer onto a capacitor, wherein the sampling network comprises a dither capacitor to inject an additive dither at a summing node of the sampling network; and a hold buffer to receive a held signal from the sampling network.

In Example 202, the low-power track and hold circuit of Example 201 can optionally include a chopper integrated with the sampling network to inject a multiplicative dither.

In Example 203, the low-power track and hold circuit of Example 201 or 202 can optionally include a chopper integrated with the sampling network to multiply the buffered input signal by a code.

In Example 204, the low-power track and hold circuit of any one of Examples 201-203 can optionally include the sampling network comprising a switched-capacitor network to sample the buffered input signal from the sampling buffer onto one or more capacitors.

In Example 205, the low-power track and hold circuit of any one of Examples 201-204 can optionally include the sampling network comprising: an input switch to receive the buffered input signal from the sampling buffer; and a sampling switch to sample the buffered input signal onto a capacitor during a sample phase.

In Example 206, the low-power track and hold circuit of any one of Examples 201-205 can optionally include the sampling network comprising a dither injection switched-capacitor network coupled to the summing node.

In Example 207, the low-power track and hold circuit of any one of Examples 201-206 can optionally include the dither capacitor being connected to a plate of a capacitor sampling the buffered input signal at the summing node.

In Example 208, the low-power track and hold circuit of any one of Examples 201-207 can optionally include the dither capacitor being connected to the summing node during a hold phase.

In Example 209, the low-power track and hold circuit of any one of Examples 201-208 can optionally include the sampling network comprising a first switch to connect a first and second plates of the dither capacitor to ground during a sample phase.

In Example 210, the low-power track and hold circuit of any one of Examples 201-209 can optionally include the sampling network comprising a transfer switch to connect a plate of the capacitor sampling the buffered input signal to ground during a hold phase.

In Example 211, the low-power track and hold circuit of any one of Examples 201-210 can optionally include the sampling network comprising a dither transfer switch to connect a plate of the dither capacitor to a node having a dither voltage level during a hold phase.

In Example 212, the low-power track and hold circuit of any one of Examples 201-211 can optionally include the sampling network comprising a dither injection switch to connect a plate of the dither capacitor to a node having a dither voltage level during a hold phase.

In Example 213, the low-power track and hold circuit of any one of Examples 201-212, wherein the sampling network comprises a dither transfer switch to connect a plate of the dither capacitor to the summing node during a hold phase.

In Example 214, the low-power track and hold circuit of any one of Examples 201-213 can optionally include the summing node being at a bottom plate of a capacitor sampling the buffered input signal.

In Example 215, the low-power track and hold circuit of any one of Examples 201-214 can optionally include the summing node being downstream of an output switch that transfers the buffered input signal and the additive dither to the hold buffer.

In Example 216, the low-power track and hold circuit of any one of Examples 201-213 can optionally include the summing node being upstream of an output switch that transfers the buffered input signal and the additive dither to the hold buffer.

Example 217 is a method for sampling an input signal, the method comprising: buffering an input signal; during a first phase, sampling the buffered input signal onto a capacitor in a sampling network and resetting a dither capacitor; during a second phase, transferring the buffered input signal to a summing node, injecting an additive dither signal to the summing node using a dither capacitor, and outputting a held signal having the buffered input signal and the additive dither signal; and buffering the held signal to generate a buffered signal for driving one or more analog-to-digital converters.

In Example 218, the method of Example 217 can optionally include randomly chopping the buffered input signal in the sampling network based on a multiplicative dither.

In Example 219, the method of Example 217 or 218 can optionally include multiplying the buffered input signal in the sampling network based on a code sequence.

Example 220 is a low-power track and hold circuit, the low-power track and hold circuit comprising: a sampling buffer; a sampling network to sample a buffered input from the sampling buffer onto a capacitor and transfer the buffered input to a summing node, wherein the sampling network comprises a dither injection switched-capacitor network to add an dither to the summing node; and a hold buffer to receive a held signal from the summing node.

Examples of Multi-Input ADCs

Some of the multi-input ADCs do not use a summer and separate T/H circuits or separate sample-and-hold circuits to receive and combine multiple inputs. Rather, many of the multi-input ADCs describe herein utilize a split T/H circuit to accommodate and multiplex multiple inputs, where the signals are combined through charge redistribution of the sampling caps (without requiring a summer). Having separate, full T/H circuits can consume more power. A summer to add multiple input signals (possibly having different frequencies) could potentially create an aggregate signal that would necessitate a quantizer with a very wide dynamic range.

With spread spectrum coding in a split T/H circuit, it is possible to multiplex signals efficiently and effectively in the front-end circuitry of a multi-input ADC.

Example 301 is a multi-input analog-to-digital converter (ADC), comprising: parallel switched-capacitor networks, wherein: each parallel switched-capacitor network comprises a circuit for coding a respective input signal using a respective code sequence; and the parallel switched-capacitor networks combine coded input signals at a common node through charge redistribution of sampling capacitors in the parallel switched-capacitor networks; and a quantizer to generate a digital output signal based on a multiplexed coded signal at the common node.

In Example 301, the multi-input ADC of Example 301 can optionally include parallel sampling buffers to buffer respective input signals before the respective buffered input signals are sampled onto the respective sampling capacitors in the parallel switched-capacitor networks.

In Example 303, the multi-input ADC of Example 301 or 302 can optionally include a hold buffer to buffer the multiplexed coded signal at the common node before a buffered multiplexed coded signal is digitized by the quantizer.

In Example 304, the multi-input ADC of any one of Examples 301-303 can optionally include parallel decoders to demultiplex the digital output signal from the quantizer into separate digital output signals using the respective code sequences.

In Example 305, the multi-input ADC of any one of Examples 301-304 can optionally include the circuit for coding the respective input signal using a respective code sequence comprising a chopper circuit integrated within a given parallel switched-capacitor network.

In Example 306, the multi-input ADC of any one of Examples 301-305 can optionally include each one of the parallel switched-capacitor networks including: multiple time-interleaved sampling networks.

In Example 307, the multi-input ADC of any one of Examples 306-306 can optionally include each one of the parallel switched-capacitor networks including: parallel sampling capacitors to implement a spreading factor, wherein the spreading factor is a ratio between a holding rate and a sampling rate.

In Example 308, the multi-input ADC of any one of Examples 301-307 can optionally include parallel open-loop track and hold circuits to provide respective held signals to the respective parallel switched-capacitor networks.

In Example 309, the multi-input ADC of Example 308 can optionally include the respective parallel switched-capacitor networks up-sampling the respective held signals to implement a spreading factor; and the spreading factor being a ratio between a holding rate and a sampling rate.

In Example 310, the multi-input ADC of any one of Examples 301-309 can optionally include: peak detectors to detect respective signal levels of the respective input signals.

In Example 311, the multi-input ADC of Example 310, wherein the peak detectors output respective flags to an external circuit driving the multi-input ADC to perform automatic gain control.

In Example 312, the multi-input ADC of Example 310 or 311, further comprising: a variable gain amplifier to amplify the multiplexed coded signal at the common node; wherein the peak detectors control a gain of the variable gain amplifier.

Example 313 is a method for multiplexing inputs in an analog-to-digital converter, the method comprising: coding, in respective parallel signal paths, respective input signals using respective code sequences; multiplexing coded input signals through charge redistribution of parallel sampling capacitors in the parallel signal paths; and converting, by a quantizer, a multiplexed coded input signal into a digital output signal.

In Example 314, the method of Example 313 can optionally include demultiplexing the digital output signal from the quantizer into separate digital output signals using the respective code sequences.

In Example 315, the method of Example 313 or 314 can optionally include coding a given input signals comprising swapping differential signal paths based on values of a given code sequence.

In Example 316, the method of any one of Examples 313-315 can optionally include sampling respective input signals onto respective parallel sampling capacitors in respective parallel switched-capacitor networks.

In Example 317, the method of any one of Examples 313-316 can optionally include buffering the multiplexed coded input signal before prior to the converting of the multiplexed coded input signal.

Example 318 is a multiple-input multiple-output analog-to-digital converter, comprising: parallel channels to sample respective input signals and code the respective input signals; a common node to multiplex coded input signals through charge redistribution of sampling capacitors in the parallel channels; an analog-to-digital converter to convert a multiplexed coded signal into a digital output signal; and parallel demultiplexers to demultiplex the digital output signal.

In Example 319, the multiple-input multiple output analog-to-digital converter of Example 318, can optionally include parallel peak detectors to detect signal levels of the respective input signals and to adjust respective gains of the respective input signals.

In Example 320, the multiple-input multiple output analog-to-digital converter of Example 318 or 319 can optionally include a coding scheme used to code the respective input signals in the parallel channels being configurable to suit one or more of the following: signal condition(s) and requirement(s) of the multiple-input multiple-output analog-to-digital converter.

Example 1001 is a multi-input ADC comprising parallel switched-capacitor networks and a quantizer for generating a digital output; wherein each switched-capacitor network comprises a circuit for coding a respective input signal using a respective orthogonal pseudo-random number sequence; and the parallel switched-capacitor networks combines the coded input signals at a node through charge redistribution of sampling capacitors in the parallel switched-capacitor networks.

In Example 1002, the multi-input ADC of Example 101 can further include a plurality of parallel sampling buffers for buffering the respective input signals before sampling the respective buffered input signals onto the sampling capacitors in the respective parallel switched-capacitor networks.

In Example 1003, the multi-input ADC of Example 101 or 102 can further include a hold buffer for buffering a multiplexed signal at the node and providing a buffered multiplexed signal to the quantizer for digitizing the buffered multiplexed signal.

In Example 1004, the multi-input ADC of any one of Example 101-103 can further include parallel decoders for demultiplexing the digital output into separate digital outputs using the respective orthogonal pseudo-random number sequences.

In Example 1005, the multi-input ADC of any one of Example 101-104 can further include the circuits for coding the respective input signals performing coding during a hold phase.

In Example 1006, the multi-input ADC of any one of Example 101-104 can further include the circuits for coding the respective input signals performing coding during a sample phase.

In Example 1007, the multi-input ADC of any one of Example 101-106 can further include the circuits for coding the respective input signals comprising chopper circuits.

In Example 1008, the multi-input ADC of any one of Example 101-107 can further include the parallel switched-capacitor networks performing non-inverted sampling.

In Example 1009, the multi-input ADC of any one of Example 101-108 can further include the parallel switched-capacitor networks performing inverted sampling.

In Example 1010, the multi-input ADC of any one of Example 101-109 can further include the parallel switched-capacitor networks performing bottom plate sampling.

In Example 1011, the multi-input ADC of any one of Example 101-110 can further include the parallel switched-capacitor networks having multiple time-interleaved sampling networks.

In Example 1012, the multi-input ADC of any one of Example 101-111 can further include the parallel switched-capacitor networks having parallel sampling capacitors to implement a spreading factor, and the spreading factor being a ratio between a holding rate and a sampling rate.

In Example 1013, the multi-input ADC of any one of Example 101-112 can further include parallel open-loop track and hold circuits for providing respective held signals to the respective parallel switched-capacitor networks; the parallel switched-capacitor networks up-sample the held signals to implement a spreading factor; and the spreading factor being a ratio between a holding rate and a sampling rate.

In Example 1014, the multi-input ADC of any one of Example 101-113 can further include peak detectors for detecting respective signal levels of the input signals.

In Example 1015, the multi-input ADC of Example 114, wherein the respective peak detectors outputs flags/bits to an external circuit driving the multi-input ADC to perform automatic gain control.

In Example 1016, the multi-input ADC of Example 114 or 115, wherein the respective peak detectors outputs flags/bits to a variable gain amplifier amplifying a multiplexed signal at the node.

Advantageously, various embodiments of the multi-input ADC can be used in multiple inputs and multiple outputs (MIMO) applications and multi-band receivers. Massive MIMO systems and multi-band requirement can present a scalability challenge. These applications can benefit from the multi-input, multi-output ADC being able to efficiently and effectively multiplex multiple inputs. The coding aspect provides spatial diversity pre-coding for 5G and massive MIMO. In the context for 5G and massive MIMO, spatial multiplexing can be used to multiplex signals spatially using specially defined codes. The circuitry in the multi-input multi-output ADC can easily be adapted to use the specially defined codes to spatially multiplex signals in the T/H circuit (i.e., in the parallel switched-capacitor networks) and demultiplex the signals in the digital domain. Furthermore, the multi-input ADC offers flexibility in allocating the ADC capacity and can make the use of channel capacity more efficiently.

Code modulation can be used in multiplexing more than one input in the same ADC while oversampling the input. It decouples the sampling rate $f_{s1}$ from the quantization rate $f_{s2}$. Advantages associated with code modulation and spread spectrum coding can include any one or more of the following:

The dynamic range requirement of the ADC increases with square root of N (N being the spreading factor).

With spread spectrum coding, the overall system dynamic range and noise spectral density improves by 10 log N (N being the spreading factor).

Even-order distortion is improved.

Oversampling the input signal is possible (fs2>fs1).

If N=4, the collective dynamic range/noise spectral density for the whole ADC is better by 6 dB. Accordingly, there is a range of flexibility/reconfigurability of 6 dB. In other words, there can be flexibility in allocating dynamic range (by 10 log N).

The multi-input ADC can be reconfigurable from single ADC to N-channel ADC (number of channels can be configurable).

The coding scheme can be used for other kinds of coding, such as: spatial multiplexing pre-coding in massive MIMO.

The multi-input ADC architecture can alleviate some of the obstacles towards adopting multi-band receivers: efficient aggregation, ADC dynamic range, AGC, and band-to-band interference due to harmonics.

Gain of each input can be dynamically allocated to better utilize the ADC and channel capacity. When spread spectrum coding is used for multiplexing multiple inputs, it is possible to adjust the gain of individual inputs dynamically based on signal conditions and/or requirements of the application. The adjustment of individual gains of inputs can be done to make use of the channel capacity and/or the dynamic range of the ADC more efficiently. Using peak detectors (e.g., illustrated in FIG. 19), the gain of individual inputs can be adjusted, and/or the gain of the multiplexed signal can be adjusted.

Inputs to the multi-input ADC can be turned off programmatically or using software. For instance, a subset of channels in the T/H circuit can be utilized while the rest of the channel(s) are turned off programmatically. In a special case, the multi-input ADC can receive a single analog input signal. Coding can be turned off and other unused channels in the T/H circuit can be turned off.

The coding scheme being used can be selected from a plurality of coding schemes or adjusted to suit signal conditions and/or requirements of the application.

VARIATIONS AND IMPLEMENTATIONS

Example A is an apparatus comprising means for implementing/carrying out any one of the methods described herein.

The alternative implementations for additive dither injection shown in FIGS. 21-24 and illustrated by Examples 201-220 and C are complementary to and can be combined in a suitable manner with the features described with respect to various examples of T/H circuits, including one or more features illustrated in Examples 1-9, Examples 101-103. The alternative implementations for additive dither injection shown in FIGS. 21-24 and illustrated by Examples 201-220 and C are complementary to and can be combined in a suitable manner with the features described with respect to various examples of T/H input circuits of the exemplary multi-input ADCs, including one or more features illustrated in Examples 301-320 and 1001-1016.

Other structures that are used in SHA-less ADCs (ADCs without sample-and-hold amplifiers) leveraging the teachings herein are also envisioned by the disclosure. However, they can be less efficient than the embodiments described herein.

Herein, switches (e.g., ones seen in the FIGURES) represent electronic circuitry which can be controlled to conduct current or not conduct current. In practice, switches can be implemented using transistors. By biasing the transistors appropriately, the transistor can conduct current or not conduct current (be "on" or "off" respectively). When the switch is closed or "on", current conducts to complete the circuit path. When a switch is opened or "off", current does not conduct and the circuit path is open. Switches can effectively connect one part of a circuit to another part of a circuit, or disconnect one part of a circuit to another part of a circuit.

Note that the activities discussed above with reference to the FIGURES are applicable to any integrated circuits that involve processing analog signals and converting the analog signals into digital data using one or more ADCs. In certain contexts, the features discussed herein related to ADCs in general, including, e.g., ADCs of various flavors including pipeline ADCs, delta sigma ADCs, successive approximation register ADCs, multi-stage ADCs, time-interleaved ADCs, randomized time-interleaved ADCs, etc. In other words, the quantizer can be implemented based on different ADC architectures.

The features can be particularly beneficial to high speed ADCs, where input frequencies are relatively high in the giga-hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on a non-transitory computer medium.

In one example embodiment, any number of components of the figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an integrated circuit that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package. In various other embodiments, calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components, or parts. However, this has been done for purposes of clarity and example only. It should be appreciated that the system can be consolidated in any suitable manner. Along similar design alternatives, any of the illustrated components, modules, blocks, and elements of the Figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the Figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion.

Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims or examples described herein. Note that all optional features of the apparatus described above may also be implemented with respect to the method or process described herein and specifics in the examples may be used anywhere in one or more embodiments.

What is claimed is:

1. A track and hold circuit, comprising:
    a sampling buffer;
    a sampling network to sample a buffered input from the sampling buffer onto a capacitor, wherein the sampling network comprises:
        an input switch to receive the buffered input from the sampling buffer;
        a sampling switch to sample the buffered input onto the capacitor during a sample phase; and
        a dither capacitor to inject an additive dither at a summing node of the sampling network; and
    a hold buffer to receive a held signal from the sampling network.

2. The track and hold circuit of claim 1, further comprising:
    a chopper integrated with the sampling network to inject a multiplicative dither.

3. The track and hold circuit of claim 1, further comprising:
    a chopper integrated with the sampling network to multiply the buffered input by a code.

4. The track and hold circuit of claim 1, wherein the sampling network comprises a switched-capacitor network to sample the buffered input from the sampling buffer onto one or more capacitors.

5. The track and hold circuit of claim 1, wherein the input switch is a bootstrapped switch bootstrapped to the buffered input.

6. The track and hold circuit of claim 1, wherein the dither capacitor is a part of a dither injection switched-capacitor network coupled to the summing node.

7. The track and hold circuit of claim 1, wherein the dither capacitor is coupled, at the summing node, to a plate of a capacitor sampling the buffered input.

8. The track and hold circuit of claim 1, wherein the dither capacitor is coupled to the summing node during a hold phase.

9. The track and hold circuit of claim 1, wherein the sampling network comprises reset switches to couple a first and second plates of the dither capacitor to ground during the sample phase.

10. The track and hold circuit of claim 1, wherein the sampling network comprises a transfer switch to couple a plate of the capacitor sampling the buffered input to ground during a hold phase.

11. The track and hold circuit of claim 1, wherein the sampling network comprises an output switch to couple a plate of the capacitor to the summing node during a hold phase.

12. The track and hold circuit of claim 1, wherein the sampling network comprises a dither transfer switch to couple a plate of the dither capacitor to the summing node during a hold phase.

13. The track and hold circuit of claim 1, wherein the sampling network comprises a dither injection switch to couple a plate of the dither capacitor to a node having a dither voltage level during a hold phase.

14. The track and hold circuit of claim 1, wherein the summing node is at a bottom plate of the capacitor sampling the buffered input.

15. The track and hold circuit of claim 1, wherein the summing node is downstream of an output switch that transfers the buffered input and the additive dither to the hold buffer.

16. The track and hold circuit of claim 1, wherein the summing node is upstream of an output switch that transfers the buffered input and the additive dither to the hold buffer.

17. A method for sampling an input signal, the method comprising:
    buffering an input signal;
    during a first phase, sampling the buffered input signal onto a capacitor in a sampling network and resetting a dither capacitor;
    during a second phase, transferring the buffered input signal to a summing node, injecting an additive dither signal to the summing node using a dither capacitor, and outputting a held signal having the buffered input signal and the additive dither signal; and
    buffering the held signal to generate a buffered signal for driving one or more analog-to-digital converters.

18. The method of claim 17, further comprising:
randomly chopping the buffered input signal in the sampling network based on a multiplicative dither.

19. The method of claim 17, further comprising:
multiplying the buffered input signal in the sampling network based on a code sequence.

20. A track and hold circuit, comprising:
a sampling buffer;
a sampling network to sample a buffered input from the sampling buffer onto a capacitor and transfer the buffered input to a summing node, wherein the sampling network includes:
 an input switch to receive the buffered input from the sampling buffer; and
 a sampling switch to sample the buffered input onto the capacitor during a sample phase; and
a dither injection switched-capacitor network to add an dither to the summing node; and
a hold buffer to receive a held signal from the summing node.

* * * * *